United States Patent [19]

Matsui et al.

[11] Patent Number: 5,845,016

[45] Date of Patent: Dec. 1, 1998

[54] IMAGE COMPRESSING APPARATUS

[75] Inventors: Hirofumi Matsui, Ikoma-gun; Kunihiko Iizuka, Sakai; Masayuki Miyamoto, Nabari; Mitsuhiko Fujio, Iizuka, all of Japan

[73] Assignee: Sharp Kabushiki Kaisha, Osaka, Japan

[21] Appl. No.: 673,720

[22] Filed: Jun. 27, 1996

[30] Foreign Application Priority Data

Jun. 28, 1995 [JP] Japan .................................... 7-162687
May 30, 1996 [JP] Japan .................................... 8-137272

[51] Int. Cl.[6] ...................................................... G06K 9/38
[52] U.S. Cl. ............................................................ 382/253
[58] Field of Search .................................... 382/253, 232, 382/239; 348/401, 405, 414, 417, 418, 421, 422

[56] References Cited

U.S. PATENT DOCUMENTS 4,910,608  3/1990  Whiteman et al. ...................... 382/253

FOREIGN PATENT DOCUMENTS 62-25577  3/1987  Japan .

OTHER PUBLICATIONS

High Efficiency Picture Coding using Vector Quanti, (T. Murakami et al, The IEICE, Tech. report vol. 85, No. 226, IT86–61 (English Translation), Dec. 1985.

Subband Coding of 3D MRI Using Octress ICASSP/95: Acoustic, Speech & Signal Processing Conf. IEEE/IEE Publications, vol. 4, 1995.

Real–time Video Compression Using Differential Vector quantizatin by Fowler et al IEEE/IEE Public, vol. 5, issue 1, Feb. 1995.

A very low bit rate video coder based on vector quantization by Corte–Real et al IEEE Transaction on Image Proc. vol. 5, issue 2, Feb. 1996.

"High Efficiency Picture Coding Using Vector Quantization" (T. Murakami et al., the IEICE (Institute of Electronics, Information and Communication Engineers of Japan) Technical Report vol. 85, No. 226, IT85–61, P1–8, Published Dec. 5, 1985).

"Vector Quantization and Its Application to Image Coding" (T. Saito et al., the IEICE Technical Report vol. 87, No. 132, IE87–58, P47–54, Published Jul. 24, 1987).

*Primary Examiner*—Joseph Mancuso
*Assistant Examiner*—Samir Ahmed
*Attorney, Agent, or Firm*—David G. Conlin; David D. Lowry

[57] ABSTRACT

An image compressing apparatus employs a mean-separated normalized vector quantization method according to which, with respect to vector components corresponding to input images inputted from image sensors via a plurality of lines, encodes and outputs a scalar-quantized code of a mean value, a scalar-quantized code of a maximum scalar product value with each code word in a code book, and an index of one of the code words which yields a maximum scalar product value. In this image compressing apparatus, when the maximum scalar product value is less than a predetermined threshold value, in accordance with judgement by a comparator circuit, an output selecting circuit stops outputting the codes of the maximum scalar product value and of the index, and outputs only the code of the mean value. Therefore, when the image is uniform with pixels varying little in their luminance levels in compression processing unit blocks, code data to be outputted are restricted so that only data of the mean value are outputted. Consequently, it is possible to restrain degradation of the image and to considerably reduce data amount.

14 Claims, 15 Drawing Sheets

IMAGE COMPRESSING APPARATUS

FIELD OF THE INVENTION

The present invention relates to an apparatus for compressing an image signal upon its transmission, recording and the like.

BACKGROUND OF THE INVENTION

Various methods are suggested for converting an image signal into a digital signal, which rarely deteriorates, upon its transmission, recording and the like. In accordance with these conversion methods, compressing methods are also suggested for, without directly transmitting or recording the digital signal, compressing the data amount to, for example, a range between a fraction of the amount and a several tenths of the amount in order to decrease its transmission time and memory data amount.

A typical example of such encoding methods is the vector quantization method, which works as explained below. First, an analog signal to be compressed is divided into compression processing unit blocks of, for example, 6×6=36 pixels. Then those compression processing unit blocks are sequentially scanned to determine the signal level of each pixel, which in turn becomes the vector component $x_k$ of a K-dimensional input vector $\vec{x}$. Here k represents a pixel number, and k=1, 2, ..., K. In this example K equals 36.

Meanwhile, a plural kinds of images are prepared in advance for learning. A code word $\vec{c}i$ is defined as a vector for learning which is obtained in the same manner as above for image signals of the image for learning. A code book b, composed of such code words $\vec{c}i$ which correspond to the respective signals, is then stored. Here i represents an identification number, and i=1, 2, ..., M. Hereinafter i will be referred to as an index. Then the code word $\vec{c}i$ which is the closest to the input vector $\vec{x}$ is chosen from the code words $\vec{c}i$ in the stored code book b. Then only the index i of that chosen code word $\vec{c}i$ is transmitted or recorded.

Namely, the code word $\vec{c}I$ giving the smallest value for the equation:

$$|\vec{x} - \vec{ci}|^2 = \sum_{k=1}^{K} (xk - cik)^2 \quad (1)$$

is determined and its index I is transmitted or recorded.

As a result, the data amount per 1 vector equals $\log_2 M$ (bits). For example, suppose that 256 (=M) code words are stored in the code book b for the previously mentioned compression processing unit blocks of K=6×6=36 pixels, since $256=2^8$, 8/36=0.22 (bit/pixel). Thus, the data amount is reduced to 1/36 of the case where scalar quantization of 8 bits is performed for each pixel.

The normalized vector quantization (also called as the gain/shape vector quantization) method for compressing data amount has been created by further improving the vector quantization method. According to the normalized vector quantization method, the size of the code words C1 through CM in the code book B are 1. Namely, $$|Ci|=(Ci, Ci)^{1/2}=1$$

The code word CI which produces a maximum value for the scalar products of the input vector $\vec{x}$ and the code words Ci, namely, $$(\vec{x}, \vec{Ci}) = \sum_{k=1}^{K} (xk \cdot Cik) \quad (2)$$

is determined. Then the input vector $\vec{x}$ is expressed as:

$$\vec{x}=SQ\{(\vec{x}, \vec{CI})\}\cdot\vec{CI} \quad (3)$$

wherein $SQ\{(\vec{x}, \vec{CI})\}$ is a scalar amount of the scalar product $(\vec{x}, \vec{CI})$.

The input vector $\vec{x}$ is expressed as Eq. (3) for the following reasons. Suppose that A is a scalar amount, since $|Ci|^2=1$, the following equation is obtained:

$$|\vec{x} - A \cdot \vec{Ci}|^2 = |\vec{x}|^2 - 2A(\vec{x}, \vec{Ci}) + A^2|\vec{Ci}|^2 \quad (4)$$
$$= \{A - (\vec{x}, \vec{Ci})\}^2 + |\vec{x}|^2 - (\vec{x}, \vec{Ci})^2$$

In the above equation, the relationship between the second and third terms of the right side, $|\vec{x}|^2$ and $(\vec{x}, Ci)^2$, is $|(\vec{x}, \vec{Ci})|^2 \leq |\vec{x}|^2$. Therefore, when the code word Ci equals the code word CI which maximizes the scalar product $(\vec{x}, Ci)$, and A equals $(\vec{x}, Ci)$, the left side of Eq. (4) takes its minimum value, so $SQ\{(\vec{x}, \vec{CI})\}\cdot\vec{CI}$ becomes the vector which is the closest to the input vector $\vec{x}$.

Hence, the code book B necessary to both a compressing side and an extension side can be made smaller. Namely, the number of stored code words M is reduced.

In addition, the mean-separated normalized vector quantization (also called as the differential normalized vector quantization or mean/gain/shape vector quantization) method has been created and suggested by further improving the normalized vector quantization method in order to reduce the number of stored code words M. According to the mean-separated normalized vector quantization method, the mean value μ of the components of the input vector $\vec{x}$ is obtained from the following equation:

$$\mu = \frac{1}{K} \cdot \sum_{k=1}^{K} xk \quad (5)$$

Next, a difference component vector X=(X1, X2, ..., XK) is obtained by subtracting the mean value μ from the input vector $\vec{x}$ as in the following equation:

$$\vec{X}=\vec{x}-\mu\cdot\vec{U} \quad (6)$$

Note that $\vec{U}=(1, 1, ..., 1)$.

Then, the code word $\vec{CI}$ maximizing the absolute scalar product value $|(\vec{X}, \vec{Ci})|$ is determined out of the code words $\vec{Ci}$, unit-length code words in the code book B used for the normalized vector quantization method. The maximum value P of the scalar product $(\vec{X}, \vec{Ci})$ and the mean value μ obtained in this manner are scalar-quantized, and the index I is binarized so that codes are compressed and then transmitted or recorded.

In accordance with the compressed codes which have been transmitted or reproduced, an extension apparatus decodes an output vector $\vec{x}$ out in the following manner:

$$\vec{x}out=Pa\cdot\vec{CI}+\mu a\cdot\vec{U} \quad (7)$$

wherein Pa and μa represent, respectively, the maximum absolute value of the scalar-quantized scalar product value P and a quantized central value of the mean value μ.

A typical conventional technique employing the above-mentioned mean-separated normalized vector quantization method is disclosed, for example, in Japanese Laid-Open Patent Application No. 62-25577/1987 (Tokukaishou 62-25577). According to this conventional technique, when the power of an input vector of the compression processing unit block is great, a vector quantization is carried out utilizing a code book with long bits, that is, with large numbers of gradation: when the power is small, data is compressed with the mean-separated normalized vector quantization method.

As discussed so far, when the transmission rate is very small, such as an analog telephone line and cellular phone line, image signals of a dynamic image can not be transmitted even with a mean-separated normalized vector quantization method for compressing data amount, because the data is not compressed enough.

SUMMARY OF THE INVENTION

It is an object of the present invention to provide an image compressing apparatus which is able to further reduce data amount.

In order to achieve the above object, a first image compressing apparatus in accordance with the present invention has:

a plurality of scalar product value calculating sections for calculating scalar product values of a difference component vector and each code word, the difference component vector being generated by subtracting, from each vector component, a mean value of the vector components of an input vector expressing image signals received for every predetermined compression processing unit block, the code word being generated from image signals of a plurality of kinds of predetermined images for learning;

a scalar-quantization section for scalar-quantizing the mean value and a maximum scalar product value;

an encoding section for encoding an identification number of one of the code words, the code word yielding the maximum scalar product value through the calculation by the scalar product value calculating section;

a comparator section for judging whether the maximum scalar product value is not less than a predetermined threshold value; and an output selecting section for, in accordance with the judgement by the comparator section, outputting the quantization code of the mean value from the scalar quantization section, the quantization code of the maximum scalar product value from the scalar quantization section and the identification code of the code word from the encoding section when the maximum scalar product value is not less than the threshold value, and outputting only the quantization code of the mean value when the maximum scalar product value is less than the threshold value.

In order to achieve the above object, a second image compressing apparatus in accordance with the present invention has:

a mean value calculating section for calculating a mean value of vector components of an input vector expressing image signals received for every predetermined compression processing unit block;

a mean value separating section for generating a difference component vector by subtracting the calculated mean value from each of the vector components of the input vector;

a memory section for storing vectors for learning generated from image signals of a plurality of kinds of predetermined images for learning as code words;

a scalar product value calculating section for calculating scalar product values of the difference component vector and each of the code words;

a maximum scalar product value detecting section for detecting one of the code words, the code word yielding a maximum scalar product value through the calculation;

a mean value quantization section for scalar-quantizing the mean value;

a gain quantization section for scalar-quantizing the maximum scalar product value;

a vector encoding section for encoding an identification number of the code word yielding the maximum scalar product value;

a comparator section for judging whether the maximum scalar product value is not less than a predetermined threshold value;

an output selecting section for, in accordance with the judgement by the comparator section, outputting the quantization code of the mean value from the mean value quantization section, the quantization code of the maximum scalar product value from the gain quantization section and the identification code of the code word from the vector encoding section when the maximum scalar product value is not less than the threshold value, and outputting only the quantization code of the mean value when the maximum scalar product value is less than the threshold value.

The first and second image compressing apparatuses allows the output selecting section to output only the quantization code of the mean value when the maximum scalar product value is less than the predetermined threshold value, that is, when the image in the compression processing unit block is relatively uniform.

To describe more details, the image is divided into the compression processing unit blocks having, for example, K pieces of pixels, and the compression processing unit blocks are sequentially scanned to obtain signal levels of the pixels, which in turn are designated as the vector components of a K-dimensional input vector. As the input vector thus obtained from the image signals is received, the mean value of the vector components is calculated first, and then the component difference vector is obtained by subtracting the mean value from each of the vector components of the input vector. Specifically, the calculation of the mean value is carried out by the mean value calculation section of the second image compressing apparatus. Besides, the calculation of the difference component vector is carried out by the mean value separating section of the second image compressing apparatus.

The scalar product value calculating section calculates the scalar product values of the code words and the difference component vector obtained by the mean value separating section. From the results of the calculation by the scalar product value calculating section, the maximum scalar product value detecting section detects the code word yielding the maximum value for the scalar product values corresponding to the code words, that is, the code word which is closest to the input vector. Note that in the second image compressing apparatus, the code words are stored in the memory section as vectors for learning obtained from the image signals of the plurality of kinds of predetermined images for learning.

The mean value, the maximum scalar product value, and the identification number of the code word yielding the maximum scalar product value obtained in this manner are encoded for transmittance, recording and so on. More specifically, in the first image compressing apparatus, the mean value and the maximum scalar product value are scalar-quantized by the scalar quantization section, and the identification number is encoded into the identification code by the encoding section. Meanwhile, in the second image compressing apparatus, the mean value is scalar-quantized by the mean value quantization section, the maximum scalar product value is scalar-quantized by the gain quantization section, and the identification number is encoded into the identification code by the vector encoding section.

Moreover, in the first and second image compressing apparatuses, upon transmittance, recording or so on, the comparator section judges whether the maximum scalar product value is less than the predetermined threshold value. In accordance with the judgement, the output selecting section outputs the quantization code of the mean value, the quantization code of the maximum scalar product value and the identification code when the maximum scalar product value is not less than the threshold value, and outputs only the quantization code of the mean value when the maximum scalar product value is less than the threshold value.

Therefore, when the image is almost uniform across the compression processing unit block, the output of the quantization code of the maximum scalar product value and the identification code is stopped. Meanwhile, on the decompressing side, decoding into the image signals is carried out with the code word of the identification code and the mean value outputted before the output is stopped. It is thus possible to reproduce an image which the viewer can not differentiate from an image in a case where all the data are transmitted or recorded, to restrain degradation of the image signal, and to reduce the data amount to be transmitted, recorded and so on as much as possible.

The first and second image compressing apparatuses preferably has:

a low band buffer for generating a low band vector for every low band compression processing unit block composed of a plurality of compression processing block units by receiving the mean values at a predetermined cycle; and a low band vector quantization section for vector-quantizing the low band vector with the mean-separated normalized vector quantization method, wherein the output selecting section outputs a quantization code of a low band mean value, a quantization code of a low band maximum scalar product value and a low band identification code, i.e., an identification number of the code word yielding the low band maximum scalar product value, instead of the quantization code of the mean value.

With the above arrangement, the mean-separated normalized vector quantization is further carried out with the quantization code of the maximum scalar product value and the identification code obtained by the first or second image compressing apparatus as high band components and the mean value of the smaller data amount per pixel as low band components. It is thus possible to further reduce the data amount without damaging the image quality.

The output selecting section in the first and second image compressing apparatuses preferably outputs selectively the quantization code of the mean value, a quantization code of the low band mean value obtained by further vector-quantizing the mean value with the mean-separated normalized vector quantization method, the quantization code of the low band maximum scalar product value and the low band identification code.

With the arrangement, it is possible to switch the compression methods according to whether the decompressing side (for example, a receiver or a reproducing apparatus) has an advanced function of decoding the code which is further vector-quantized from the mean value with the mean-separated normalized vector quantization method.

Moreover, the scalar product value calculating section in the first and second image compressing apparatuses preferably includes an amplifier and capacitors corresponding to code components of each of the code words, wherein the scalar product value calculating section calculates scalar product values of the input vector and each of the code words in a parallel manner for each of the code words by inputting input signals of a plurality of channels corresponding to the vector components to a terminal of each of the capacitors and connecting the other terminals of the capacitors commonly to the amplifier.

With the arrangement, the input signals of the channels corresponding to the vector components are processed in a parallel manner by using the code words as analog signals without being converted to digital signals. On the contrary, in a case where analog signals are processed after being converted to digital signals, if the number of the code words is increased, the calculation amount increases considerably. Therefore, the calculation processing section is required to have a high performance, which leads to high cost and high power consumption. On the contrary, these problems are less likely to occur with analog signal processing in the above arrangement.

More preferably, the capacities of the capacitors in the scalar product value calculating section are set in a capacity ratio as the quantized code components, wherein each of the scalar product value calculation sections includes a correction capacitor corresponding to quantization error caused by the capacitor and inputs a product of a electrostatic capacity of the correction capacitor and the mean value to the amplifier as a correction value.

With the above arrangement, upon integration of the first and second image compressing apparatuses, even if, for example, a problem in the process causes the results of calculation of the scalar product values to include the quantization error due to the quantization error of the code component corresponding to the capacitor capacity, it is possible to correct the quantization error with the correction capacitor. It is thus possible to realize the correction of the quantization error by adding only the correction capacitors. Therefore, it is possible to express the code components highly accurately with small capacitor areas.

The first and second image compressing apparatuses preferably has:

an input vector inversion selecting section for inverting polarity of the input vector and selectively changing-over obtained inverted and non-inverted values to be outputted; and an inversion & comparator section for, in accordance with the change-over operation of the input vector inversion selecting section, comparing the two scalar product values calculated by the scalar product value calculating section using the non-inverted and inverted values with each other, and outputting a greater scalar product value of the two and the code of the greater scalar product value.

With the above arrangement, the input vector inversion & comparator section selects a bigger value of the two scalar product values: one is obtained from the non-inverted value and the other from the input vector whose polarity is inverted by the input vector inversion selecting section, i.e., the inverted value. The two scalar product values thus obtained are respectively equivalent to the scalar product values of the input vector with the non-inverted and inverted values of the code components. Therefore, it is possible to increase the indexes of the code words by 1 bit, that is, double the number of the code words, without increasing the area needed for mounting capacitors by adding only a simple circuit.

The code word employed in the first and second image compressing apparatuses is preferably one of a plurality of vectors for learning obtained in accordance with inputted image signals, the vector of learning having a power greater than a predetermined threshold value and great changes in images in the compression processing unit blocks.

Therefore, the code word is composed of only a vector for learning obtained from an image which has relatively large change in the image (e.g., an image including an edge) and which is suitable as a vector for learning, not including a blurry vector for learning obtained from an image which has a power less than the threshold value and little change in the image in the compression processing unit block and which is not suitable as an image for learning. This prevents an objectionably blurry vector to be adopted as the code word and allows the code word which is highly likely to agree with various inputted image signals to be included as the code word.

For a fuller understanding of the nature and advantages of the invention, reference should be made to the ensuing detailed description taken in conjunction with the accompanying drawings.

DESCRIPTION OF THE EMBODIMENTS

Referring to FIGS. 1 through 7, the following description will discuss a first embodiment in accordance with the present invention.

Figure 1:
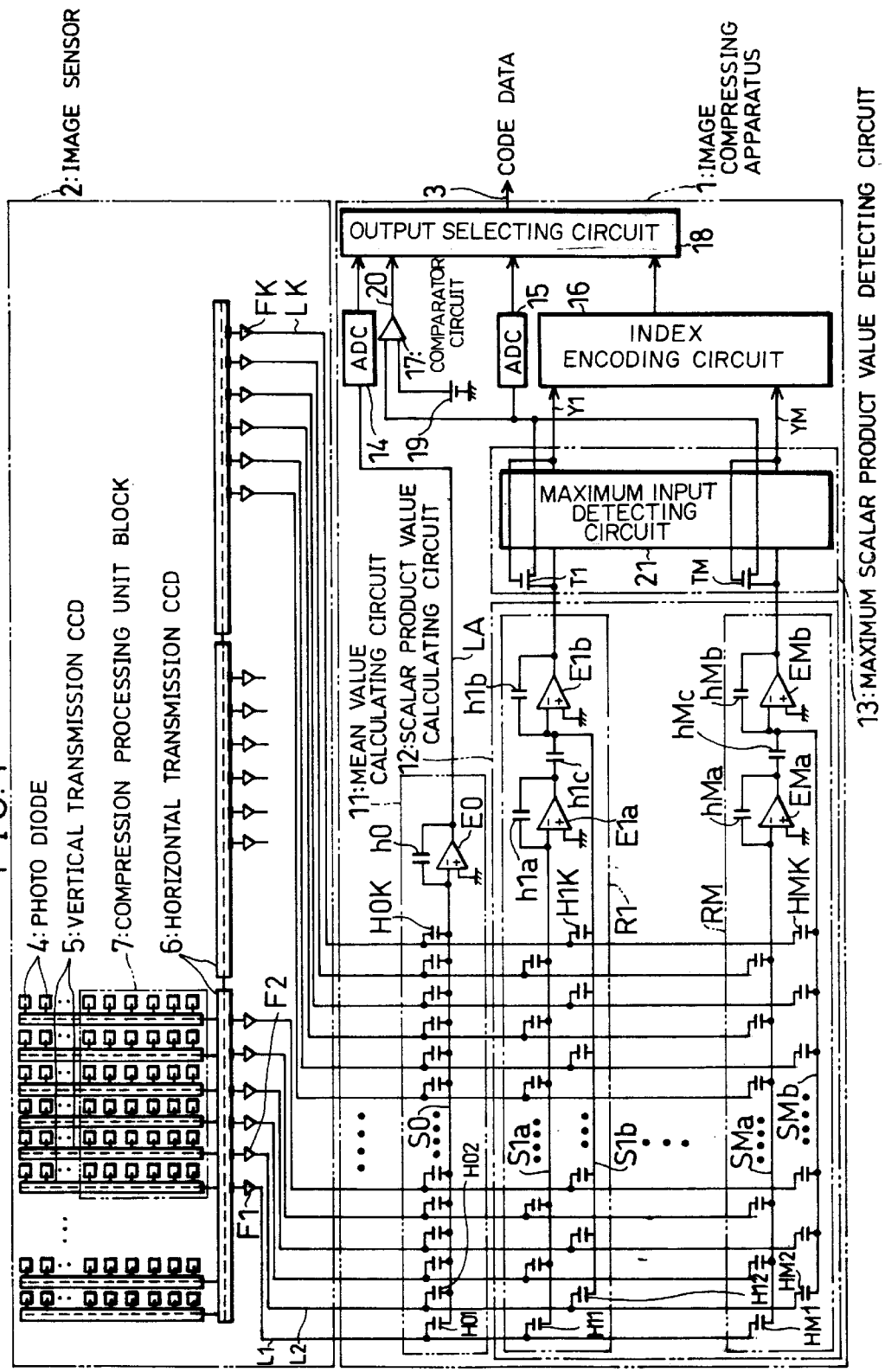
FIG. 1 is a block diagram showing an electric arrangement of an image compressing apparatus and an associated image sensor of a first embodiment in accordance with the present invention.

FIG. 1 is a block diagram showing an electric arrangement of an image compressing apparatus 1 and an associated image sensor 2 of the first embodiment in accordance with the present invention. The image compressing apparatus 1 compresses (encodes) an image signal from the image sensor 2, and outputs code data obtained with the compression to a transmitter, recording device, and so on via an output line 3 in a manner described later.

The image sensor 2 is composed of a large number of photo diodes 4 arranged in a matrix form. The photo diodes 4 in each column are connected to a vertical transmission CCD (charge coupled device) 5, and an end of the vertical transmission CCD 5 is connected to a horizontal transmission CCD 6. Analog voltages hold by elements of each of the horizontal transmission CCDs 6 are outputted from the elements via a buffer Fk (k=1, 2, . . . , K) to a line Lk (k=1, 2, . . . , K).

Figure 2:
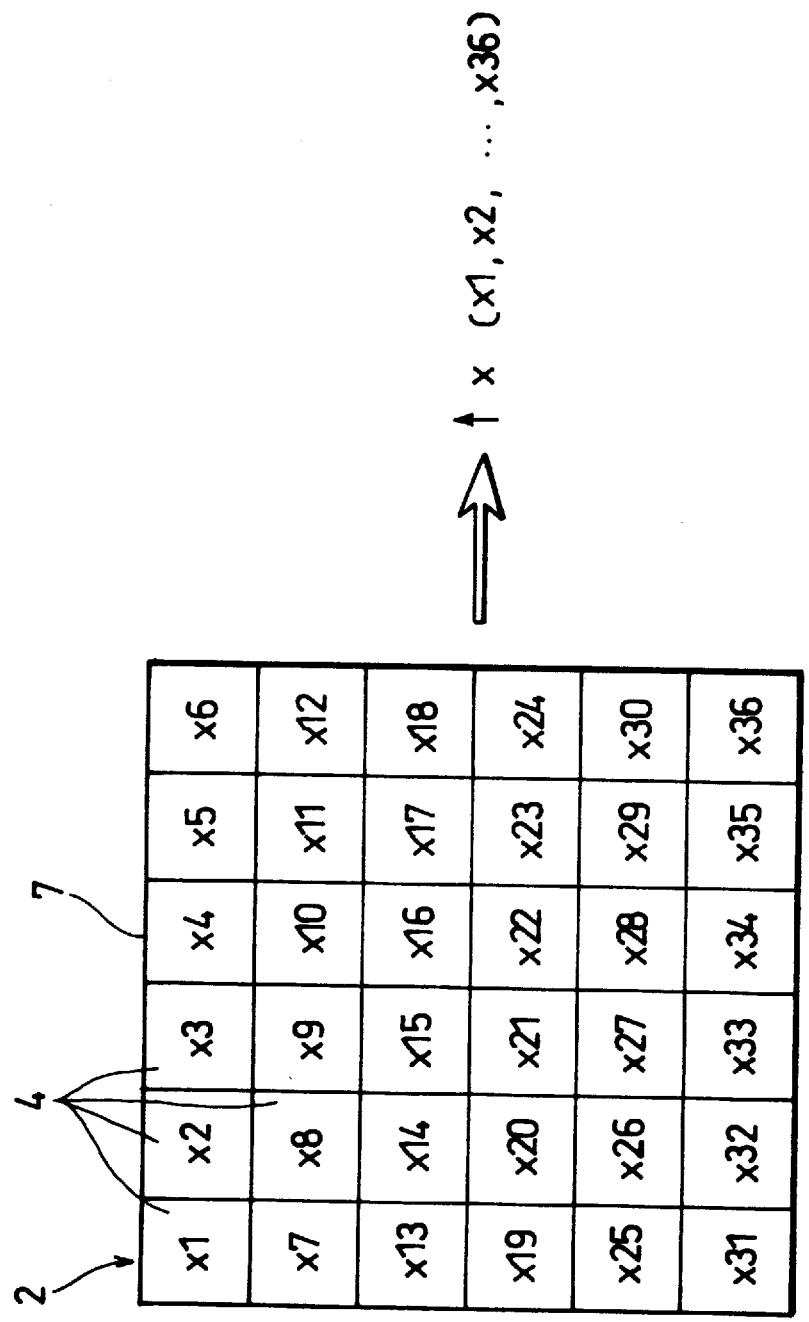
FIG. 2 is a drawing illustrating in what order luminance levels of pixels in compression processing unit blocks on the image sensor are read in as vector components.

As shown in FIG. 2, the photo diodes 4 in the image sensor 2 are divided into, for example, a plurality of compression processing unit blocks 7 of K=6 pixels ×6 pixels= 36 pixels. Output voltages of the photo diodes 4 are read out from the compression processing unit blocks 7 in a sequential manner by the vertical transmission CCDs 5 and the horizontal transmission CCDs 6, and then outputted to the lines L1 through LK. Consequently, as shown in FIG. 2, the image compressing apparatus 1 is fed with a K-dimensional input vector $\vec{x}$ whose vector components are signal levels x1, x2, . . . , xK corresponding to luminance levels of an object created in the respective photo diodes 4.

The image compressing apparatus 1 roughly has a mean value calculating circuit 11, a scalar product value calculating circuit 12, a maximum scalar product value detecting circuit 13, an A/D converters 14 and 15, an index encoding circuit 16, a comparator circuit 17 and an output selecting circuit 18.

The mean value calculating circuit 11 includes a differential amplifier E0 and K pieces of unit capacitors H0k (k=1, 2, . . . , K as already mentioned) in accordance with the number of the dimension K of the input vector $\vec{x}$. The unit capacitors H0k are connected at one of their ends to the inversion input terminal of the differential amplifier E0 via an input line S0, and at the other ends to the respective lines Lk. The differential amplifier E0 is grounded at its non-inversion input terminal, allowing the ground level to function as the reference voltage vref. The non-inversion input terminal and output terminal of the differential amplifier E0 are connected with each other by a feedback capacitor h0.

Here, letting vk represent an input voltage from the line Lk, vo represent an output voltage of the differential amplifier E0, H0k and h0 respectively represent electrostatic capacities of the unit capacitor H0k and of the feedback capacitor h0, Eq. (8) is obtained according to the principle of conservation of charge at the contact points of one of the ends of the unit capacitors H0k and the non-inversion input terminal of the differential amplifier E0:

$$vo - vref = - \sum_{k=1}^{K} \frac{H0k}{h0} \cdot (vk - vref) \qquad (8)$$

This explains that scalar product values of vector components (v1–vref, v2–vref, ... vK–vref) and their coefficients (−H01/h0, −H02/h0, ... , −H0K/h0) can be calculated as (vo–vref).

Consequently, supposing that H0k/h0=1/K for all the unit capacitors H0k, the output voltage vo of the differential amplifier E0 to the line LA equals the mean value of voltages of the lines L1 through LK. The output voltage vo is inputted to the A/D converter 14 (a mean value quantization section). Therefore, the mean value of the voltages of the lines L1 through LK (i.e., the mean value of the vector components x1 through xK of the input vector $\vec{x}$) are scalar-quantized and outputted by the A/D converter 14. The outputted quantized codes are inputted to the output selecting circuit 18.

The scalar product value calculating circuit 12 includes a plurality (i pieces) of scalar product value calculating sections Ri (i=1, 2, ... , M). Each of the scalar product value calculating sections R1 through RM includes (1) K pieces of code component capacitors H11, H12, ... , H1K; H21, ... , H2K; ... ; and HM1, ... , HMK, and (2) two differential amplifiers E1a and E1b; E2a and E2b; ... ; and EMa and EMb. Hereinafter, H11 through H1K provided in R1 will be referred to as H1; H21 through H2K in R2 as H2; and so on. All the code component capacitors will be exclusively referred to as Hik.

In the scalar product value calculating section R1, the code component capacitors H11 through H1K are connected at one of their ends to a line S1a or S1b, and at the other ends to respective lines L1 through LK. The lines S1a and S1b are connected respectively to the inversion input terminals of the differential amplifiers E1a and E1b. The non-inversion input terminals of the differential amplifiers E1a and E1b are grounded. The inversion input terminals and the output terminals of the differential amplifiers E1a and E1b are respectively connected with each other via feedback capacitors h1a and h1b. The output of the differential amplifier E1a is fed to the inversion input terminal of the differential amplifier E1b via a capacitor h1c. The capacitors h1a, h1b and h1c are designated to have the same electrostatic capacities.

As a result, the output of the differential amplifier E1a is inverted and amplified by the differential amplifier E1b with gain 1 before being outputted. The code component capacitors H11 through H1K have electrostatic capacities which make the above coefficients positive coefficients when connected to the line S1a, and have electrostatic capacities which make the above coefficients negative coefficients when connected to the line S1b. This allows the maximum scalar product value detecting circuit 13 to be fed with an output voltage in accordance with the scalar product value. The rest of the scalar product value calculating sections R2 through RM have the same arrangement, and their outputs are fed to the maximum scalar product value detecting circuit 13.

Each of the code component capacitors H1, H2, ... , HM is arranged in the respective scalar product value calculating section R1 through RM so that the total electrostatic capacity of the positive coefficients and that of the negative coefficients share the same absolute value. Therefore, the code component capacitors H1 through HM in the scalar product value calculating sections R1 through RM are mean-separated code words. Since a mean value is separated from each of the code component capacitors H1 through HM in the scalar product value calculating sections R1 through RM as mentioned above, the voltages outputted to the lines S1a and S1b; ... ; and SMa and SMb are equivalent to levels from which the mean value obtained from the unit capacitors H01 through H0K in the mean value calculating circuit 11 is already subtracted. The scalar product value calculating circuit 12 also functions as a mean value separating section. In addition the scalar product value calculating circuit 12 functions as a memory section having a code book of M pieces of code words.

The maximum scalar product value detecting circuit 13 has a maximum input detecting circuit 21 and switching elements Ti (i=1, 2, ... , M as already mentioned) corresponding to the respective scalar product value calculating sections Ri. Output lines Yi corresponding to the respective scalar product value calculating sections Ri extend from the maximum input detecting circuit 21. The maximum input detecting circuit 21 outputs a high-level output only to the output line of the channel corresponding to the scalar product value calculating section producing the highest input voltage of all the voltages inputted from the scalar product value calculating sections Ri, and turns all the other channels to a low level.

The output lines Yi are connected to the index encoding circuit 16 (a vector encoding section). The index encoding circuit 16 converts the index of the channel which is judged to have the maximum scalar product value into binary codes, and then outputs the binary codes to the output selecting circuit 18.

The output lines Yi are connected to the respective gates of the switching elements Ti. Therefore, the highest voltage of all the input voltages from the scalar product value calculating sections Ri is selected by the switching elements Ti, and then inputted to the A/D converter 15 (a gain quantization section). The voltage level is scalar-quantized by the A/D converter 15 and then inputted to the output selecting circuit 18.

Moreover, the voltage selected by the switching elements Ti is inputted to one of the terminals of the comparator circuit 17. A reference voltage source 19 is connected to the other terminal of the comparator circuit 17. Therefore, the comparator circuit 17 judges if the maximum value of the scalar product values calculated by the scalar product value calculating circuit 12 is not less than a threshold value designated by the reference voltage source 19. If the maximum value is not less than the threshold value, the comparator circuit 17 feeds a high level output to the output selecting circuit 18 via a line 20, whereas if the maximum value is less than the threshold value, the comparator circuit 17 turns the line 20 to a low level.

If the line 20 is in the high level, the output selecting circuit 18 outputs, to the output line 3, code data of the mean value and of the maximum scalar product value inputted from the A/D converters 14 and 15, and index code data about the scalar product value calculating section producing the maximum scalar product value. On the other hand, if the line 20 is in the low level, the output selecting circuit 18 outputs only the code data of the mean value from the A/D converter 14 to the output line 3.

Figure 3:
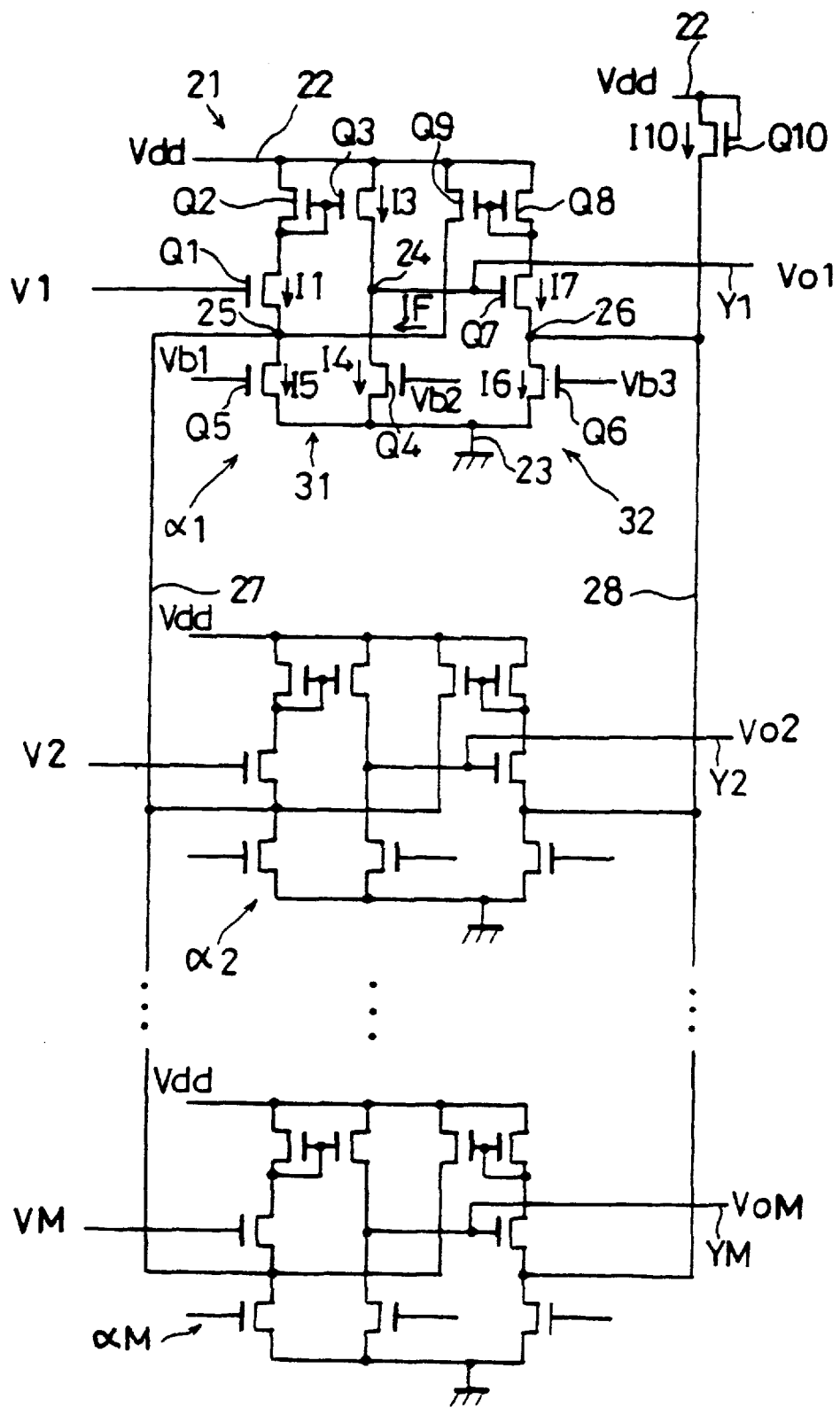
FIG. 3 is an electric circuit diagram showing a specific arrangement of a maximum input detecting circuit provided in a maximum scalar product value detecting circuit in the image compressing apparatus.

FIG. 3 is an electric circuit diagram showing a specific arrangement of the maximum input detecting circuit 21, which includes basic circuits αi corresponding to respective analog input voltages Vi of i pieces of channels.

The basic circuit α1 includes a detection section 31 having five MOS field effect transistors Q1 through Q5, and a feedback current generating circuit 32 having four field effect transistors Q6 through Q9. In the detecting section 31, the input voltage V1 from the scalar product value calculating section R1 is fed to the gate of the N-type transistor Q1, and the drain of the transistor Q1 is connected to the drain and the gate of the P-type transistor Q2.

The source of the transistor Q2 is connected to a power supply line 22 (one of the two power supply lines) maintained at a high level Vdd. The P-type transistor Q3 of the same kind with the transistor Q2 is provided correspondingly to the transistor Q2. The transistors Q2 and Q3 form a current mirror circuit. The gates of the transistors Q2 and Q3 are connected to the drain of the transistor Q1. The source of the transistor Q3 is connected to the power supply line 22, and its drain is connected to the drain of the N-type transistor Q4.

A predetermined constant voltage Vb2 is applied to the gate of the transistor Q4, and the source of the transistor Q4 is connected to the other power supply line 23 of a ground level. An output voltage Vol in accordance with the impedances of the transistors Q3 and Q4 is outputted from the contact point 24 of the transistors Q3 and Q4. The source of the transistor Q1 is connected to the drain of the N-type transistor Q5. The source of the transistor Q5 is connected to the power supply line 23, and a predetermined constant voltage Vb1 is applied to the gate of the transistor Q5.

The output voltage Vol from the contact point 24 is inputted to the feedback current generating circuit 32, being inputted to the gate of the N-type transistor Q7. The source of the transistor Q7 is connected via the N-type transistor Q6 to the power supply line 23. A predetermined constant voltage Vb3 is applied to the gate of the transistor Q6. Therefore, a bias current I6 flowing through the transistor Q6 is specified by the constant voltage Vb3 so as to be constant.

The drain of the transistor Q7 is connected to the power supply line 22 via the P-type transistor Q8. The P-type transistor Q9 is provided to make a pair with the transistor Q8. The transistors Q8 and Q9 form a current mirror circuit. The transistor Q9 positively feeds back, to a contact point 25 of the transistors Q1 and Q5, a feedback current IF corresponding to a current flowing to the transistor Q7.

The other basic circuits α2 through αM are arranged in the same manner as is the basic circuit α1. The contact points 25 of the basic circuits αi are all maintained at the same potential by a connecting line 27. The contact points 26 of the transistors Q7 and Q6 of the basic circuits αi are all maintained at the same potential by a connecting line 28.

An N-type transistor Q10 is provided for supplying the bias currents I6 of the transistors Q6 of all the basic circuits αi. The gate and drain of the transistor Q10 are connected to the power supply line 22 of the high level Vdd.

The source of the transistor Q10 is connected to the drains of the transistors Q6, that is, the connecting line 28. The transistors Q1 through Q10 operate in a saturation area.

In the maximum input detecting circuit 21 arranged as discussed above, operation of the detecting section 31 is described in detail first. The bias current I5 flowing through the transistor Q5 is specified by the constant voltage Vb1 in the above mentioned manner. Besides, the transistors Q5 are connected in parallel with each other by the connecting line 27. The source voltage of the transistor Q1 is, therefore, specified to a value according to which the feedback current IF from all the transistors Q9, the sum total M·I5 of currents I5 flowing through the transistors Q5, and a current I1 corresponding to the difference between the input voltage Vi and the source voltage of the transistor Q1 are balanced.

Consequently, a voltage corresponding to the difference between the impedance of the transistor Q3 through which a current I3 flows and the impedance of the transistor Q4 through which the current I4 specified by the constant voltage Vb2 flows is outputted as an output voltage Voi out of the contact point 24, and inputted to the gate of the transistor Q7. Also, consequently, the transistor Q7 receives a current I7 from the transistor Q8. The current I7 corresponds to the difference between the source voltage of the transistor Q7 and the Voi inputted to the transistor Q7. The source voltage of the transistor Q7 corresponds to a current I10 flowing through the transistor Q10 and to the sum total M·I6 of the currents I6 specified by the constant voltages Vb3 in the transistors Q6 connected in parallel with each other. Therefore, the current I7 is positively fed back Q9 to the contact point 25 as the feedback current IF specified by a ratio of currents flowing through the transistors Q8 and Q9.

Therefore, as the output voltage Voi becomes higher than a sum of the voltage of the connecting line 28 and the threshold voltage Vth required to allow the MOSFET to conduct, the feedback current generating circuit 32 positively feeds back a greater feedback current IF to the contact point 25. Therefore, as the output voltage Voi becomes higher, the current I1 flowing through the transistor Q1 (i.e., the current I3 flowing through the transistor Q3) decreases. Meanwhile, since the transistor Q7 is turned off as the output voltage Voi becomes lower than the sum voltage, the bias current I6 of the transistor Q6 is supplied from the transistor Q10. The operation is conducted sequentially by the basic circuits in ascending order in terms of the channels of the input voltages Vi. As a result, only the basic circuit with the maximum input outputs a high level as the output voltage Voi, and the maximum value is thus selected.

Figure 4:
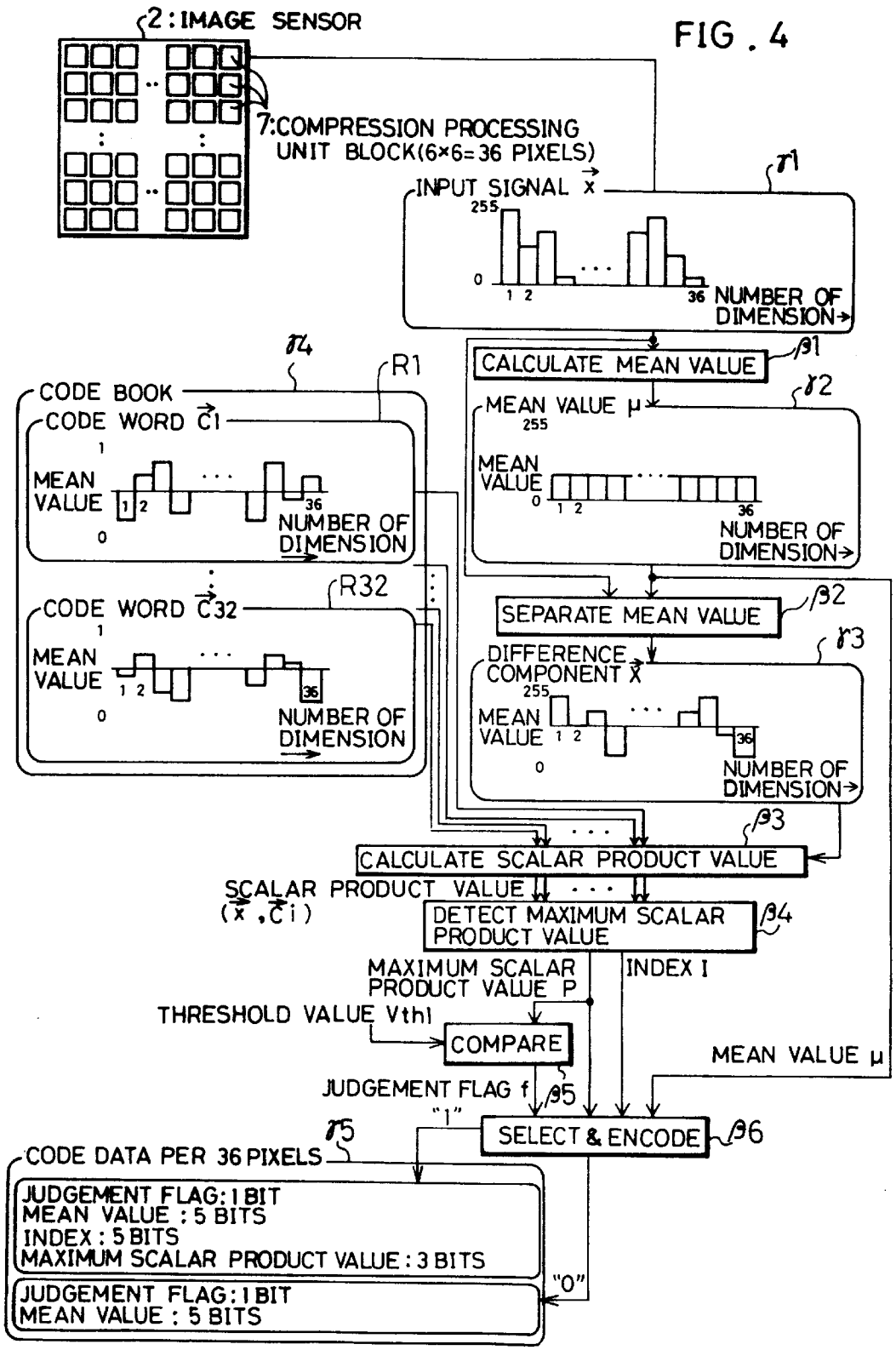
FIG. 4 is a flow chart showing compressing operation of the image compressing apparatus.

FIG. 4 is a flow chart illustrating compressing operation of the image compressing apparatus 1 arranged in the above manner. Output voltages of the photo diodes 4 are scanned sequentially by the CCDs 5 and 6, and the image signal is inputted from the image sensor 2 to form the 36-dimensional input vector $\vec{x}$ illustrated in γ1 for every compression processing unit block 7. The photo diodes 4, CCDs 5 and 6, and the buffers F1 through F36 and the like output the image signal in accordance with the luminance level of the inputted image (for example, with resolution of 256 gradations).

The image signals are inputted to the mean value calculating circuit 11, and their mean value $\mu$ is calculated in the step β1 according to Eq. (5). A mean value signal illustrated in γ2 is outputted from the mean value calculating circuit 11.

The image signal is inputted to the scalar product value calculating circuit 12. First, in the step β2, the mean value $\mu$ is subtracted from the vector components x1 through x36 to generate a difference signal corresponding to a difference component vector X=(X1, X2, . . . , X36) illustrated in γ3. Next, in the step β3, in the scalar product value calculating sections R1 through R32, calculation of scalar product values of the difference signal and each of the code words C1 through C32 (illustrated in γ4) is carried out by the mean-separated code component capacitors H1 through H36.

In the step β4, in the maximum scalar product value detecting circuit 13, the code word $\vec{CI}$ which yields the maximum scalar product value P is detected out of the scalar product values calculated in the step β3. After the maximum scalar product value P is obtained, in the step β5, in the comparator circuit 17, the maximum scalar product value P and the threshold value Vth1 corresponding to the output voltage of the reference voltage source 19 are compared. If the maximum scalar product value P is not less than the threshold value Vth1, a judgement flag f is set to 1. If the maximum scalar product value P is less than the threshold value Vth1, a judgement flag f is reset to 0.

In the step β6, as illustrated in γ5, in accordance with the judgement flag f, the A/D converters 14 and 15, the index encoding circuit 16, and the output selecting circuit 18 output the code data of the mean value μ, the index I and the maximum scalar product value P along with the code data of the judgement flag f if the judgement flag f is 1, and output only the code data of the mean value μ along with the code data of the judgement flag f if the judgement flag f is 0. The judgement flag f is expressed in 1 bit, for example, the mean value μ and the index I are expressed in 5 bits, and the maximum scalar product value P is expressed in 3 bits.

The code data fed from the output selecting circuit 18 to the output line 3 is given to and transmitted by a transmitter, or given to and recorded by a recording apparatus. Therefore, in accordance with the judgement flag f, the code data received by a receiver, or reproduced by a reproducing apparatus are decoded from the mean value μ, the index I, and the maximum scalar product value P into the image signals of the compression processing unit blocks 7 if the judgement flag f is 1, and are decoded from the mean value μ if the judgement flag f is 0. The images decoded from the compression processing unit blocks 7 are sequentially arranged to be at places predetermined on the image to be decoded, and a decoded image is thus produced.

Here, supposing that the code word $\vec{CI}$ yielding the maximum scalar product value P equals (CI1, CI2, . . . , CIK), since each code word Ci is mean-separated, the following equation is obtained:

$$|\vec{CI}| = \left( \sum_{k=1}^{K} CIk^2 \right)^{1/2} = 1 \qquad (9)$$

$$P = (\vec{X}, \vec{CI}) = |\vec{X}||\vec{CI}|\left(\frac{\vec{X}}{|\vec{X}|}, \vec{CI}\right) = |\vec{X}|\left(\frac{\vec{X}}{|\vec{X}|}, \vec{CI}\right) \qquad (10)$$

wherein $|\vec{X}|$ and $|\vec{C}|$ are absolute values of the difference component vector $\vec{X}$ and of the code word $\vec{CI}$ respectively. Since $\vec{CI}$ is a mean-separated vector as discussed earlier, $0 \leq (\vec{X}/|\vec{X}|, \vec{CI}) \leq 1$. Here, supposing that $(\vec{X}/|\vec{X}|, \vec{CI}) = \cos\theta$, this $\cos\theta$ can be considered to be an indicator for the closeness between the input vector $\vec{x}$ and the reference code word $\vec{CI}$.

When the maximum scalar product value P is less than the threshold value Vth1, according to Eq. (10), $|\vec{X}|$ is relatively small, or $\cos\theta$ is small. If $\cos\theta$ is small, it means that the code word $\vec{CI}$ which is close to the difference component vector $\vec{X}$ does not exist in the code book B. Therefore, if a proper code book B is selected (details follow) so that any given difference component vector $\vec{X}$ can be approximated by at least one code word $\vec{Ci}$, when P<Vth1, it is considered that $|\vec{X}|$ is small, i.e., that the power of the difference component vector $\vec{X}$ is small. In this case, the viewer can not recognize the difference in quality between the case where the image output vector $\vec{x}$out of the compression processing unit blocks 7 is decoded according to Eq. (7), $\vec{x}$out=Pa·$\vec{CI}$+μa·$\vec{U}$, and the case where the image output vector $\vec{x}$out is decoded according to the equation: $\vec{x}$out=μa·$\vec{U}$.

Therefore, in the present invention, as described earlier, all the code data are arranged to be outputted if P≧Vth1, whereas only the code data of the mean value μ are arranged to be outputted if P<Vth1. Thus, when the compression processing unit block where P<Vth1 occurs more often, the data amount can be made smaller and the compression rate can be improved.

Figure 5:
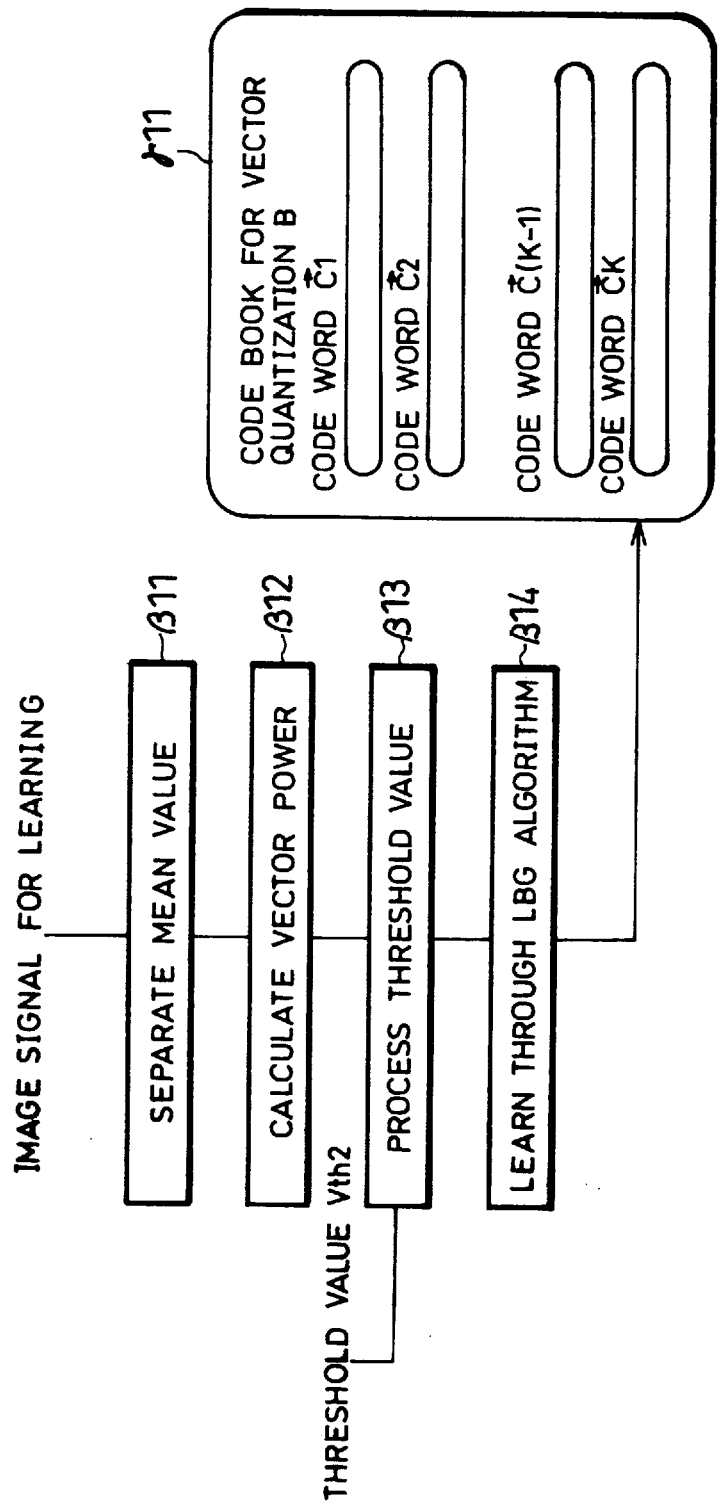
FIG. 5 is a flow chart showing process of producing a code book for compression by the image compressing apparatus.

Referring to FIG. 5, the following description will discuss how to produce the code book B capable of having the code word $\vec{CI}$ which makes the cos θ greater, that is, the code word $\vec{CI}$ which is highly likely to approximate the difference component vector $\vec{X}$. This operation is carried out by the manufacturer who produces the code book B for compressing and decompressing A large number of images for learning are divided into compression processing unit blocks 7. Then, an input vector $\vec{x}$tn arranged as in FIG. 2, whose vector components xtnk (n=1, 2, . . . , N) are data expressing luminance level of each pixel of the compression processing unit block 7 in 8 bits, i.e., 256 tones is read in. First, in the step β11, a mean value μtn is obtained according to Eq. (5), and the mean value μtn is separated from each vector component xtnk as in the following equation in order to obtain a difference component vector $\vec{X}$tn:

$$\vec{X}tn = \vec{x}tn - \mu tn = (Xtn1, Xtn2, \ldots, XtnK) \qquad (11)$$

Next, in the step β12, the vector power $|\vec{X}tn|$ of the difference component vector $\vec{X}$tn is calculated according to Eq. (12).

$$|\vec{X}tn| = (Xtn1^2 + Xtn2^2 + \ldots + XtnK^2)^{1/2} \qquad (12)$$

In the step β13, it is judged whether the power $|\vec{X}tn|$ is not less than a predetermined threshold value Vth2. Only the difference component vector with a power not less than the threshold value Vth2 is used as a vector $\vec{X}$tn for learning. In the step β14, the code book B illustrated in γ11 is produced according to the LBG (Linde, Buzo and Gray) algorithm (details follow).

According to the LBG algorithm, the space formed by the many vectors $\vec{X}t1, \vec{X}t2, \ldots, \vec{X}tN$ for learning is divided into a plurality of areas (called levels). In the above example, the space is divided into M pieces of areas: r1 through rM. Then, representative vectors $\vec{X}01, \vec{X}02, \ldots, \vec{X}0M$ are determined so as to minimize the sum of distances between the representative vectors and all the vectors for learning included in the respective areas r1 through rM. The produced representative vector is used as the code word $\vec{C}i$ in the present invention. In the scalar product value calculating sections R1 through RM, capacities of the code component capacitors Hi1 through HiK are set in accordance with the 8-bit, or 256-tone, data of the code components Ci1 through CiK of the obtained code word Ci.

Figure 6:
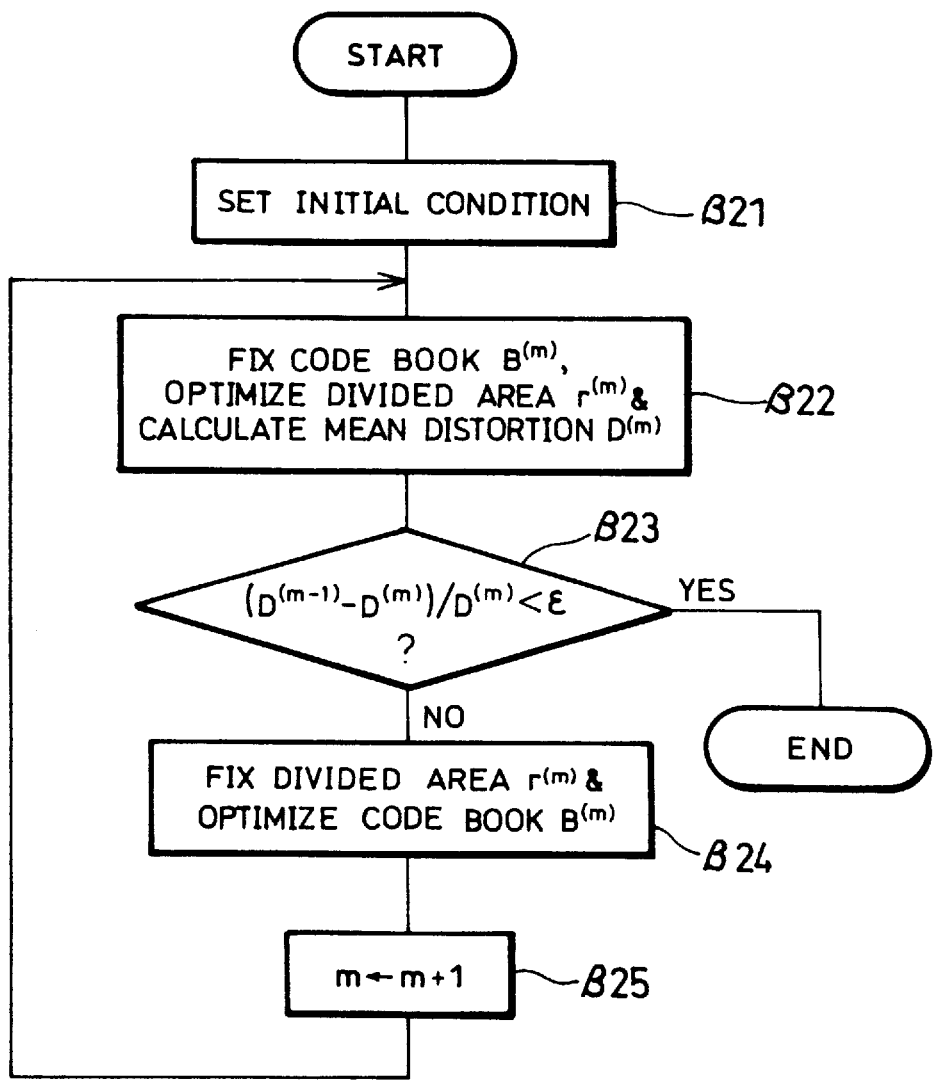
FIG. 6 is a flow chart showing LBG algorithm process of obtaining code words from a plurality of vectors for learning for producing the code book.

FIG. 6 is a flow chart illustrating process of the LBG algorithm. In the step β21, the number K of dimensions, the number M of levels and a threshold value ε for convergence judgment are initialized. Also, a variable m (m=0, 1, 2, ...) representing the number of renewals of the divided areas is reset to 0, and an initial distortion $D^{(-1)}$ is set to $+\infty$. Moreover, the code book B composed of the quantization representative vectors $\vec{X}01$ through $\vec{X}0M$ is set to the initial condition code book $B^{(0)}$ obtained with a splitting algorithm (details follow).

In the step β22, the code book $B^{(m)}$ is fixed and the divided areas $r^{(m)}$ are determined. Then distances (i.e., distortions) between the vectors for learning included in the divided areas $r^{(m)}$ in that dividing state and the quantization representative vectors included in those divided areas $r^{(m)}$ are obtained, and so is the mean value $D^{(m)}$ of those distortions. In the step β23, a rate of change between the mean value $D^{(m-1)}$ of the distortions in the dividing state of the divided areas $r^{(m-1)}$ of the preceding time and the mean value $D^{(m)}$ of the distortions in the dividing state of the divided areas $r^{(m)}$ of the present time is obtained. Then it is judged whether the rate of change is below the threshold value ε for convergence judgment. If the rate of change is below the threshold value ε, the quantization representative vectors are set as the code words, and the setting of the code book B is finished. If not, the algorithm proceeds to the step β24.

In the step β24, the divided areas $r^{(m)}$ are fixed, and the quantization representative vectors in the code book $B^{(m)}$ are set as respective center-of-gravity vectors in the divided areas $r^{(m)}$. In the step β25, the variable m is added with 1 and then the algorithm returns to the step β22. The quantization representative vectors with the minimum distortions from the vectors for learning in the divided areas r1 through rM (the divided areas of the level number M) are obtained by repeating the steps β22 through β25 in this manner, and set as the code words $\vec{C}i$ of the code book B. The capacities of the code component capacitors Hi1 through HiK are determined in accordance with the vector components of the code words $\vec{C}i$ produced in this manner.

FIG. 7(a) through 7(e) illustrate the concept of splitting algorithm, a method for obtaining the initial code book $B^{(0)}$. With the splitting algorithm, two code words which are close to each other (e.g., CM1 and CM2) are produced out of the code words $\vec{C}1$ through $\vec{C}M$ in the code book B(M) of M levels by using a micro vector $\vec{\delta}$ according to the following equation.

$$\vec{C}_{M1} = \vec{C}_M - \vec{\delta}$$

$$\vec{C}_{M2} = \vec{C}_M + \vec{\delta} \quad (13)$$

Figure 7A:
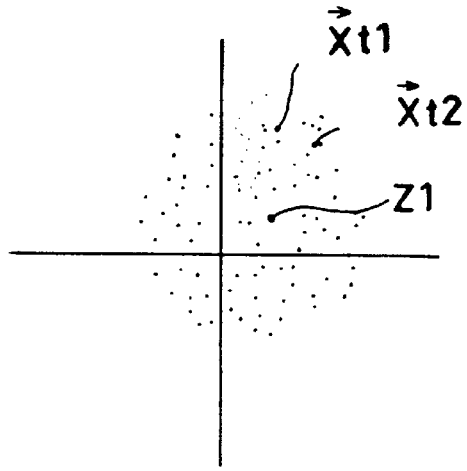
FIG. 7(a) through 7(e) are drawings showing a concept of splitting algorithm for initializing the code book in the LBG algorithm.

First, as shown in FIG. 7(a), center-of-gravity vectors of all the vectors $\vec{X}t1$ through $\vec{X}tN$ for learning are determined and set as a representative point Z1 of the level 1.

Figure 7D:
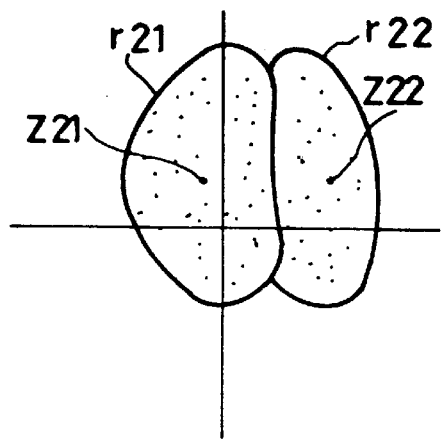
Figure 7B:
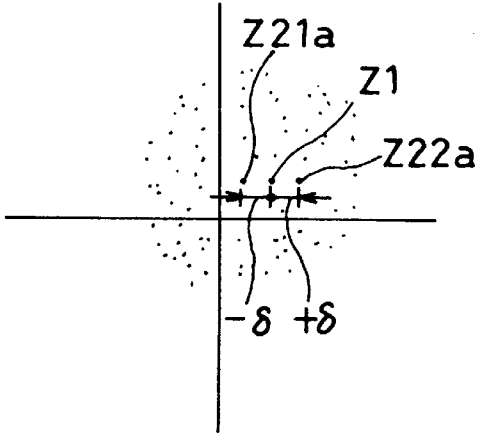

Next, as shown in FIG. 7(b), the representative point Z1 is displaced by the predetermined dividing parameter δ to determine representative points Z21a and Z22a of the level 2.

Then, the distances between the vectors $\vec{X}t1$ through $\vec{X}tN$ for learning and either of the two representative points Z21a and Z22a are calculated. As shown in FIG. 7(c), boundaries of areas r21 and r22 to which the vectors $\vec{X}tn$ for learning belong are changed so as to minimize the sum of the distances between each of the vectors $\vec{X}tn$ for learning and either of the two representative points Z21a and Z22a. The change of the boundaries is repeated until the rate of change of the sum of the distances does not exceed a predetermined value of ε.

Dividing of the vector space is thus completed. Then, in the same manner as in FIG. 7(a), as shown in FIG. 7(d), center-of-gravity vectors of the vectors for learning belonging to the areas r21 and r22 are determined in the areas r21 and r22, and the mean values of those center-of-gravity vectors are set as representative points Z21 and Z22 at the level 2.

Figure 7E:
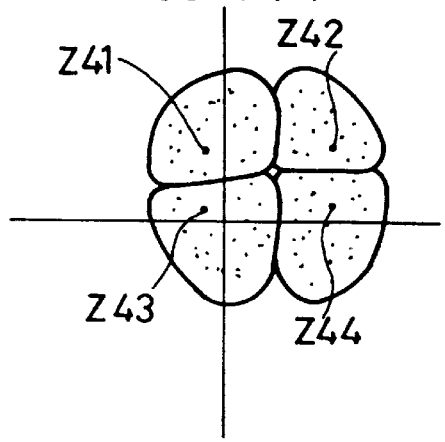
Figure 7C:
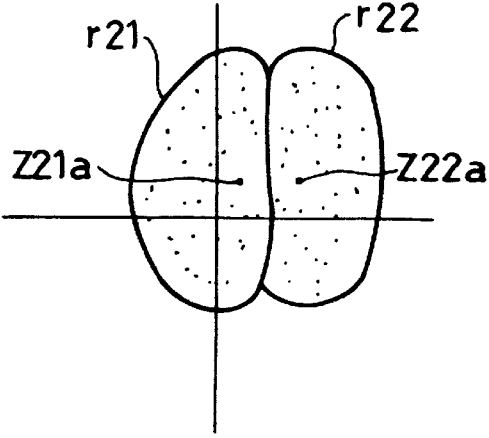

Next, as shown in FIG. 7(e), the representative points Z21 and Z22 are displaced by the dividing parameter δ to determine representative points Z41, Z42, Z43 and Z44 at the level 4. In the same manner as above, the areas are divided, and representative points are determined. This operation is repeated until the desired exponent level number (=code word number) M of 2 is attained.

Table 1 shows results of experiments by the inventors of the present invention. The code words $\vec{C}i$ used in the experiments are learned under the following conditions: (1) the number N of vectors for learning corresponding to the compression processing unit blocks 7 obtained from a large number of images for learning composed of 512 pixels ×512 pixels is set to 28900, (2) the number K of dimensions of the vectors $\vec{X}tn$ for learning is set to 36, (3) the number M of levels is set to 32, which equals the number of code words, (4) the dividing parameter δ is set to 0.1, (5) the convergence judgement value ε is set to 0.0001. Three kinds of experiments I, II and III are conducted with respect to sample images (i) through (vi) which are different from the above mentioned images for learning.

In the experiment I, the threshold value Vth 2 used during learning is not set. That is, all the input vectors $\vec{x}tn$ are used as vectors $\vec{X}tn$ for learning. In addition, the threshold value Vth 1 used during compression of code data is not set. Therefore, all the code data are outputted at any time. In the experiment II, the threshold value Vth 2 is not set, and only the threshold value Vth 1 is set. In the experiment III, both threshold values Vth2 and Vth1 are set. In the Table 1, numbers in the upper half of every block show data amount per one pixel in bits/pixel after compression. Numbers in the lower half show S/N ratios, or image quality, in dB.

TABLE 1

|  | Sample Image 1 | Sample Image 2 | Sample Image 3 | Sample Image 4 | Sample Image 5 | Sample Image 6 | Average Value |
|---|---|---|---|---|---|---|---|
| Experiment 1 | 0.4444 | 0.4444 | 0.4444 | 0.4444 | 0.4444 | 0.4444 | 0.4444 |
|  | 25.341 | 23.885 | 23.268 | 16.978 | 22.726 | 23.035 | 23.372 |

TABLE 1-continued

|  | Sample Image 1 | Sample Image 2 | Sample Image 3 | Sample Image 4 | Sample Image 5 | Sample Image 6 | Average Value |
|---|---|---|---|---|---|---|---|
| Experiment 2 | 0.1744 | 0.1944 | 0.2659 | 0.2994 | 0.1937 | 0.1609 | 0.2148 |
|  | 24.277 | 22.823 | 22.744 | 16.865 | 22.685 | 22.270 | 22.944 |
| Experiment 3 | 0.1726 | 0.1958 | 0.2961 | 0.2669 | 0.1815 | 0.1602 | 0.2122 |
|  | 24.270 | 22.943 | 23.030 | 16.909 | 22.396 | 28.223 | 22.962 |

As is clear from the mean values of the experiments II and III, by setting the threshold value Vth2 during learning, the data amount after the compression is reduced and the image quality is also improved. As is clear from the mean values of the experiments I and II, the data amount is reduced almost by half without damaging the image quality by setting the threshold value Vth1 during compression.

As discussed so far, when relatively uniform images are obtained for all the compression processing unit blocks 7 (e.g., when the maximum scalar product value P of the input vector $\vec{x}$ corresponding to the inputted image and the code words $\vec{C}i$ in the code book B is below the threshold value Vth1), the image compressing apparatus 1 in accordance with the present invention outputs only the mean value $\mu$ of the vector components xk as the code data. On the contrary, when images with relatively large change (e.g., images including an edge where the threshold value Vth1 is exceeded) are obtained, the image compressing apparatus 1 outputs, as well as the mean value $\mu$, the maximum scalar product value P and the index I of the code word $\vec{C}I$ yielding the maximum scalar product value P as the code data. Therefore, the data amount is considerably reduced without damaging the image quality to such an extent that the viewer can recognize the quality difference.

Since upon learning the code words $\vec{C}i$ in the code book B, only the input vectors $\vec{x}tn$ having power $|\vec{X}tn|$ not less than the threshold value Vth2 are set as the vectors $\vec{X}tn$ for learning, relatively uniform and blurry images across the compression processing unit blocks 7 which are not suitable for learning are eliminated, and only images with relatively great change which are suitable for learning can be used. Therefore, the code book B does not include objectionably blurry images. It is also possible to store the code words which are highly likely to agree with various inputted image signals.

Figure 8:
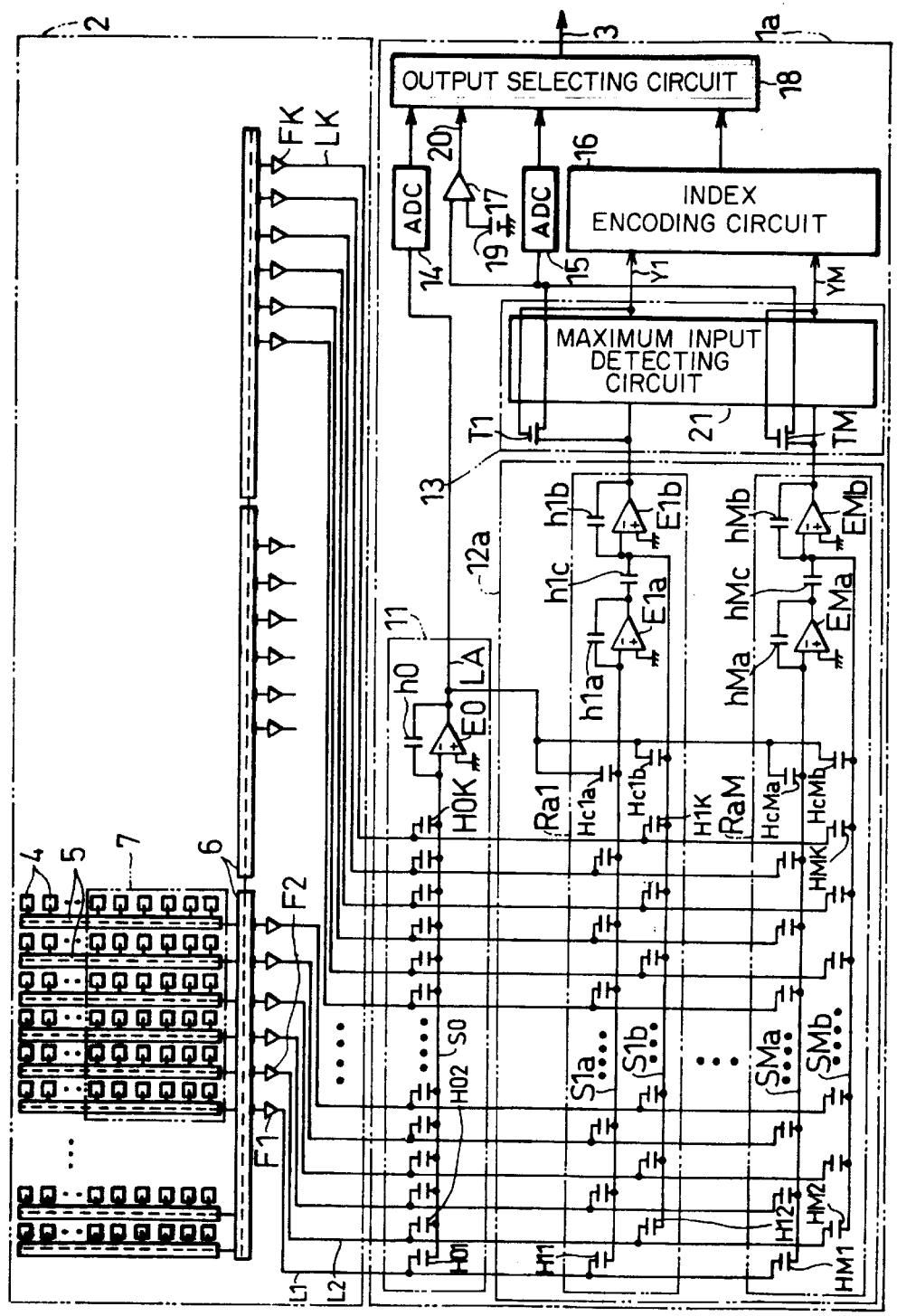
FIG. 8 is a block diagram showing an electric arrangement of an image compressing apparatus and an associated image sensor of a second embodiment in accordance with the present invention.

Referring to FIG. 8, the following description will discuss a second embodiment in accordance with the present invention.

FIG. 8 is a block diagram showing an electric arrangement of an image compressing apparatus 1a and an image sensor 2 of the second embodiment in accordance with the present invention. The image compressing apparatus 1a is similar to the image compressing apparatus 1 discussed above. Therefore, corresponding segments are indicated by the same reference numerals and description thereof is omitted. Attention should be paid where in the image compressing apparatus 1a, correction capacitors Hcia and Hcib (will be generically referred to as Hc) for correcting quantization error of a code book (detailed description follows) are provided in each scalar product value calculating section Rai in a scalar product value calculating circuit 12a.

In the image compressing apparatus 1 discussed above, each of the scalar product value calculating sections Ri in the scalar product value calculating circuit 12 realizes the code components Cik with a code component capacitor Hik. The capacitor, however, usually occupies quite a large area in an integrated circuit chip. Therefore, in an arrangement where each of the code component capacitors Hik is realized by selectively using a large number of unit capacitors in accordance with gradient of the code components Cik, it is necessary to make the unit capacitors very small. Alternatively, it is possible to realize the code components Cik by making a quantized capacitor ratio Hi1:Hi2:Hi3: . . . :Hik equal, for example, 1:2:4: . . . :2. Nevertheless, if the unit capacitors are made too small, it becomes difficult to achieve accuracy in accordance with the gradient with the present processing technology. Consequently, the quantized capacitor ratio is used.

Here, supposing that the code component capacitors Hik are not quantized and exactly correspond to the desired code components Cik, the scalar product value of the difference component vector $\vec{X}$ and the code word $\vec{C}i$ is given by the following equation:

$$(\vec{X}, Ci) = \sum_{k=1}^{K} Cik \cdot (xk - \mu) \quad (14)$$

$$= \sum_{k=1}^{K} Cik \cdot xk - \sum_{k=1}^{K} Cik \cdot \mu$$

$$= \sum_{k=1}^{K} Cik \cdot xk - \mu \sum_{k=1}^{K} Cik$$

Supposing that there occurs no quantization error, Eq. (15) is obtained:

$$\sum_{k=1}^{K} Cik = 0 \quad (15)$$

Therefore, Eq. (14) is rearranged as:

$$(\vec{X}, Ci) = \sum_{k=1}^{K} Cik \cdot xk \quad (16)$$

Therefore, this scalar product value equals the result of the scalar product value calculation directly using the input vector $\vec{x}$ shown in Eq. (2). Therefore, as shown in the image compressing apparatus 1 discussed above, even in the arrangement where the input vector $\vec{x}$ is directly inputted to each of the scalar product value calculating sections Ri without separating the mean value $\mu$, it is possible to calculate the scalar product value of the difference component vector $\vec{X}$ and each of the code words $\vec{C}i$ in an equivalent manner.

Nonetheless, if the code words $\vec{C}i$ composed of the quantized capacitors as discussed above is used, the scalar product value of the code words $\vec{C}i$ and the difference component vector $\vec{X}$ is given by the following equation:

$$(\vec{X}, Ci) = \sum_{k=1}^{K} [Cik] \cdot (xk - \mu) \quad (17)$$

$$= \sum_{k=1}^{K} [Cik] \cdot xk - \sum_{k=1}^{K} [Cik] \cdot \mu$$

$$= \sum_{k=1}^{K} [Cik] \cdot xk - \mu \sum_{k=1}^{K} [Cik]$$

$$\neq \sum_{k=1}^{K} [Cik] \cdot xk$$

Therefore, the result from directly using the input vector $\vec{x}$ from the image sensor 2 as an input to each of the scalar product value calculating sections Ri is different from the result from using the mean-separated difference component vector $\vec{X}$. Therefore, if quantization is carried out when the code component capacitors Hik are mounted on an integrated circuit, there occurs error in calculation, or selection of a wrong code word, causing different compression result.

Therefore, in the image compressing apparatus 1a, Eq. (18) is used instead of Eq. (17) in order to correct the quantization error.

$$(\vec{X}, Ci) = \sum_{k=1}^{K} [Cik] \cdot (xk - \mu) \quad (18)$$

$$= \sum_{k=1}^{K} [Cik] \cdot xk - \sum_{k=1}^{K} [Cik] + \mu \sum_{k=1}^{K} [Cik]$$

In other words, the quantization error, $-\mu\Sigma[Cik]$, is corrected by setting a correction term, $+\mu\Sigma[Cik]$.

For example, in the scalar product value calculating section Ra1, a correction capacitor Hc1b is provided to a line S1b in order to correct quantization error caused by a positive coefficient code component capacitor $H1^+$, while a correction capacitor Hc1a is provided to a line S1a in order to correct quantization error caused by a negative coefficient code component capacitor $H1^-$. The correction capacitors Hc1a and Hc1b are connected at one of their ends to the lines S1a and S1b, respectively, and are fed at the other ends with an output from the mean value calculating circuit 11 which is outputted to the line LA. In this manner, it is possible to carry out correction in accordance with the correction term, $+\mu\Sigma[Cik]$.

As discussed above, even if the input vector $\vec{x}$ from the image sensor 2 is directly inputted to each of the scalar product value calculating sections Rai, it is possible to obtain the scalar product value which is equivalent to the scalar product value obtained in the case where the difference component vector $\vec{X}$ is inputted after the mean value $\mu$ is subtracted, and to correct the code book quantization error without paying special attention to the quantization error in the code book by adding only correction capacitors Hc1a, Hc1b; . . . ; HcMa, HcMb of a simple arrangement to the scalar value calculating sections Rai in accordance with the quantization error $-\mu\Sigma[Cik]$ in the code book.

Referring to FIGS. 9 through 15, the following description will discuss a third embodiment in accordance with the present invention.

Figure 9:
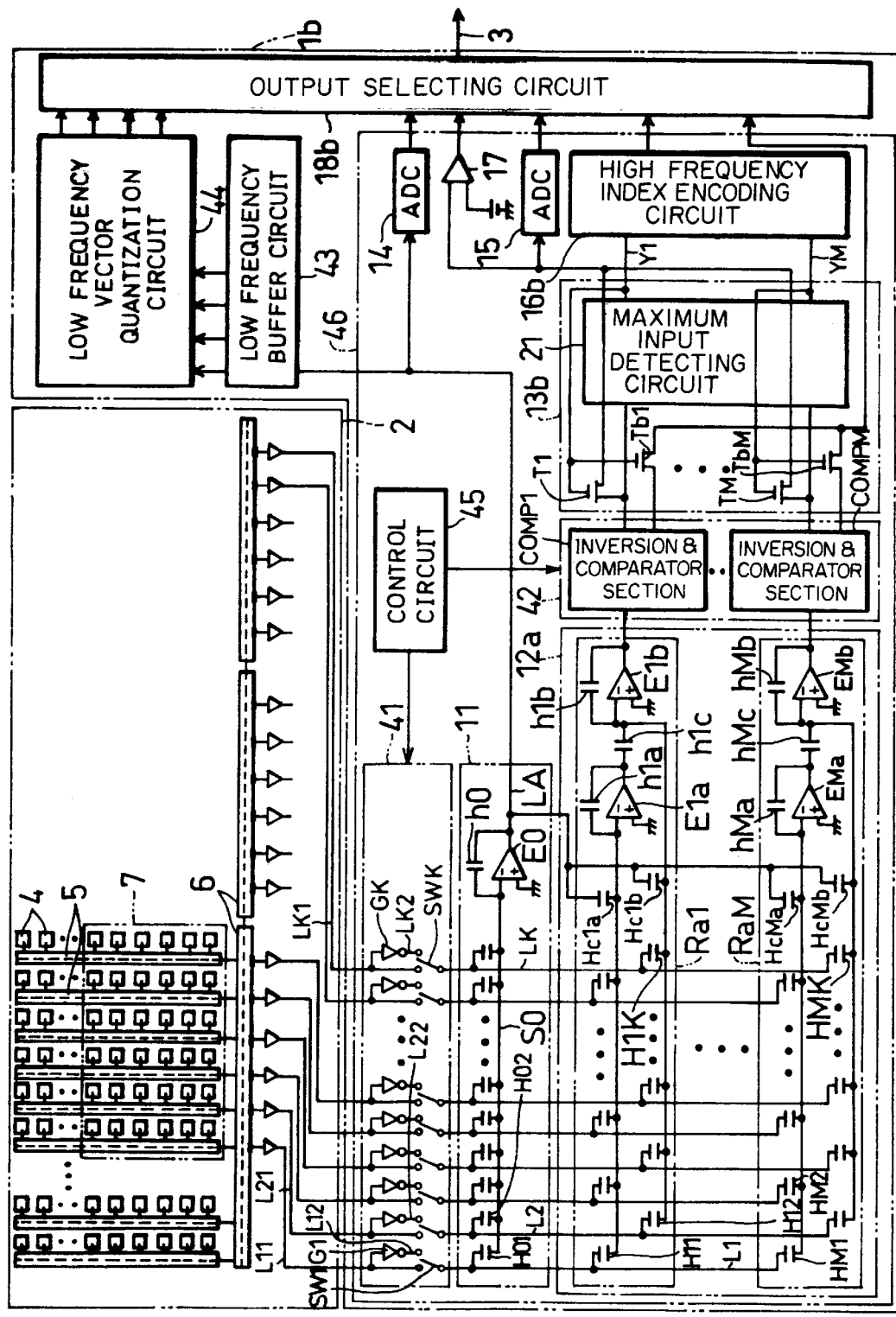
FIG. 9 is a block diagram showing an electric arrangement of an image compressing apparatus and an associated image sensor of a third embodiment in accordance with the present invention.

FIG. 9 is a block diagram showing an electric arrangement of an image compressing apparatus 1b and an associated image sensor 2 of the third embodiment of the present invention. The image compressing apparatus 1b is similar to the image compressing apparatus 1a discussed above. Therefore, corresponding segments are indicated by the same reference numerals and description thereof is omitted. Attention should be paid where in the image compressing apparatus 1b, (1) polarity of an input signal of signal level xk outputted to a line Lk1 from each buffer Fk of the image sensor 2 is switched between non-inversion and inversion and outputted to the line Lk by an input vector inversion selecting circuit 41, and (2) an inversion & comparator section COMPi in an inversion comparator circuit 42 compares the inverted and non-inverted values of an output from each scalar product value calculating section Rai in a scalar product value calculating circuit 12a with each other, outputs a bigger value of the two.

The input vector inversion selecting circuit 41 includes a change-over switch SWk and an inverter Gk in accordance with each of the lines Lk. When the change-over switch SWk is conducted to a non-inversion side, an input signal from the line Lk1 is kept non-inverted and outputted to the line Lk. On the contrary, when the change-over switch SWk is conducted to an inversion side, the input signal from the line Lk1 is inverted in respect of its polarity by an inverter Gi and then outputted from the line Lk2 to the line Lk via the change-over switch SWk. The switching state of the change-over switch SWk is interlocked with each other, and controlled by a control circuit 45. The control circuit 45 controls the polarity of the output from each of the scalar product value calculating section Rai in the inversion & comparator or section COMPi in interlock with the switching operation of the change-over switch SWk and.

Consequently, in the scalar product value calculating sections Rai, the product and sum of the code components Cik of the code words $\vec{C}i$ and the vector components xk of the input vector $\vec{x}$, and those of the code components Cik of the code words $\vec{C}i$ and the inverted values of the vector components xk are obtained. The inversion & comparator section COMPi compares the non-inverted values and inverted values of the output from corresponding scalar product value calculating section Rai, and outputs a bigger output to the maximum input detecting circuit 21. Also, a switching element Tbi is provided in accordance with each of the inversion & comparator sections COMPi in the same manner as the switching elements Ti. When the output line Yi of a corresponding channel of the maximum input detecting circuit 21 is in a high level, the switching element Tbi conducts and outputs to the output selecting circuit 18b a code fb indicating whether the output from the corresponding inversion & comparator section COMPi to the maximum input detecting circuit 21 is a non-inverted value or an inverted value.

Therefore, the scalar product values of both the non-inverted and inverted values of the input vector $\vec{x}$ are calculated with the code words $\vec{C}i$. The calculation is equivalent to calculation of the scalar product values of the input vector $\vec{x}$ with the code words $\vec{C}i$ and $-\vec{C}i$. This enables the code words $\vec{C}i$ to increase by 1 bit, that is, the number i of the code words to double, without increasing the area needed for mounting capacitors, thereby carrying out the vector quantization with high precision and efficiency.

Attention should be paid where the image compressing apparatus 1b is provided with the low band buffer circuit 43 for sampling the output from a mean value calculating circuit 11 at a predetermined cycle to generate a vector, and a low band vector quantization circuit 44 for quantizing that vector. Therefore, in the image compressing apparatus 1b, when necessary, the output from the mean value calculating circuit 11 is scalar-quantized and then outputted by an A/D converter 14, or vector-quantized and then outputted by the low band buffer circuit 43 and low band vector quantization circuit 44.

Figure 10:
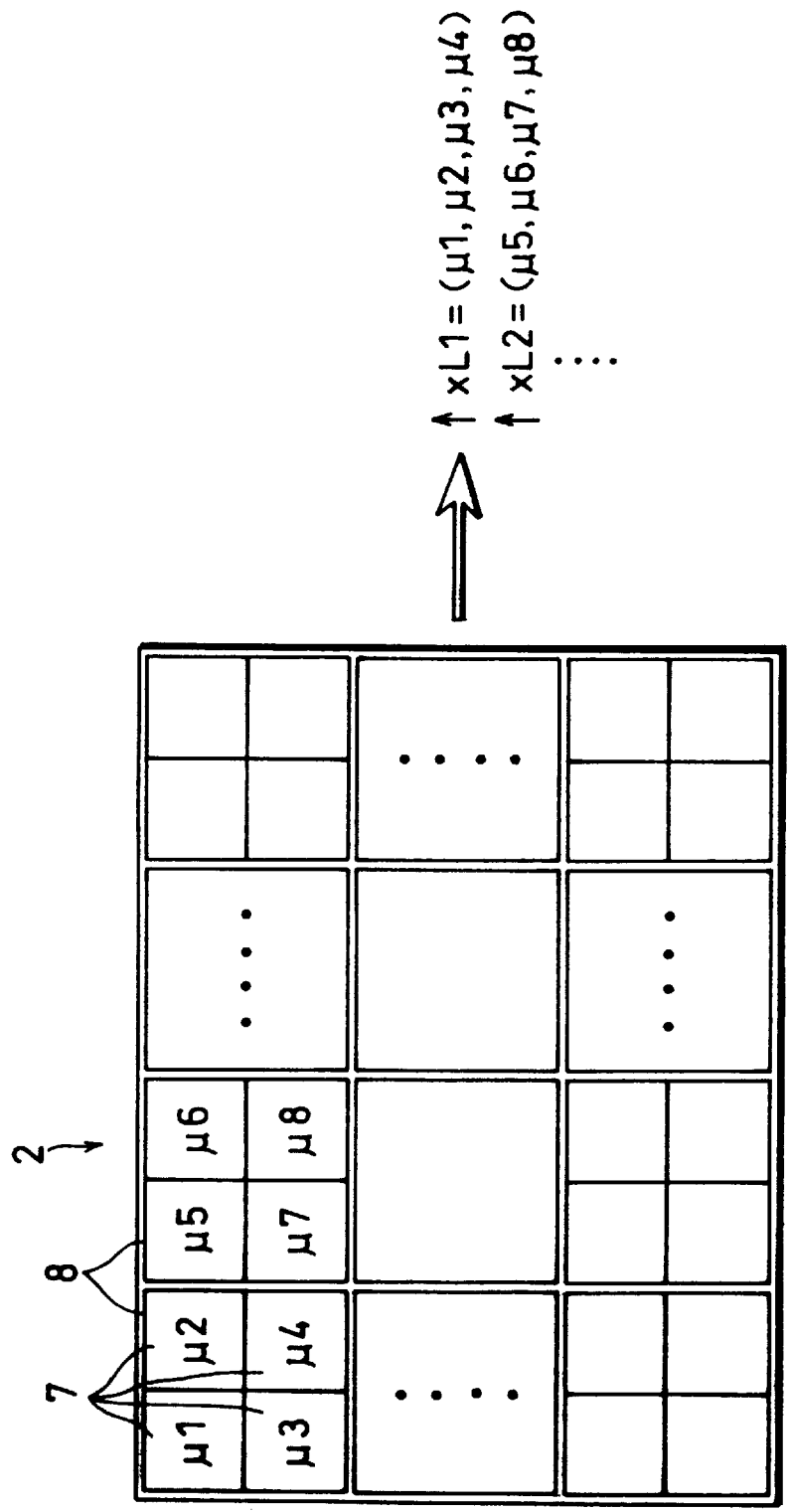
FIG. 10 is a drawing illustrating in what order mean values of compression processing unit blocks provided in a low band compression processing unit block on the image sensor are read in as vector components in the image compressing apparatus in FIG. 9.

For example, as shown in FIG. 10, a predetermined number j (j=1, 2, . . . ; and in the example shown in FIG. 10, j=4) of the compression processing unit blocks 7 are designated as one low band compression processing unit block 8. Mean value vectors $\vec{x}L1$, $\vec{x}L2$, . . . are generated for every low band compression processing unit block 8 by sampling the mean value $\mu$ in the compression processing unit blocks 7 with the low band buffer circuit 43 at every number j of the compression processing unit blocks 7. These mean value vectors $\vec{x}L1$, $\vec{x}L2$ . . . are then vector-quantized with the mean-separated normalized vector quantization method in the low band vector quantization circuit 44.

Figure 11:
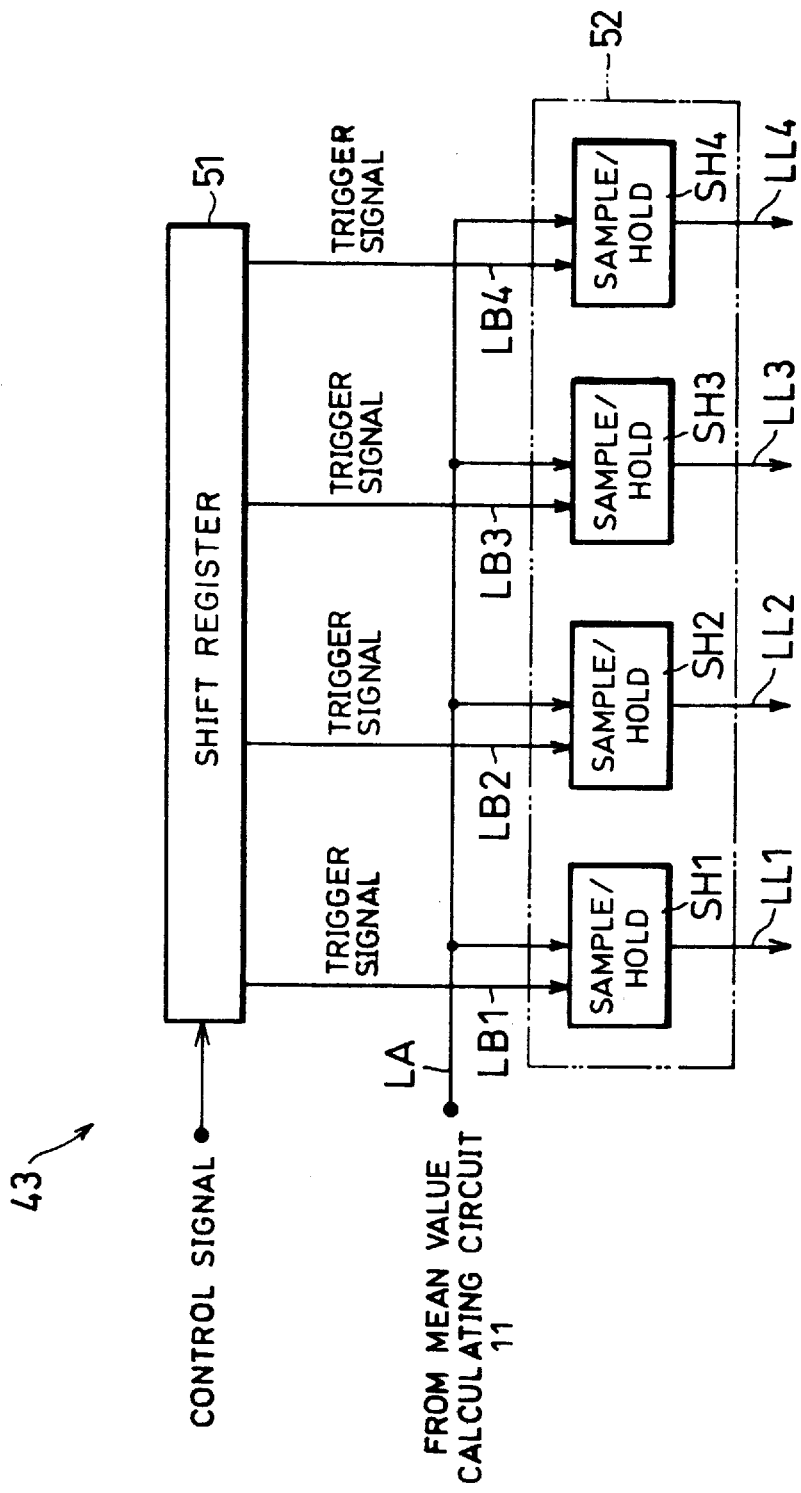
FIG. 11 is a block diagram showing an electrical arrangement of a low band buffer circuit which reads in the mean values as the vector components as shown in FIG. 10 in the image compressing apparatus in FIG. 9.

FIG. 11 is a block diagram showing an electric arrangement of the low band buffer circuit 43. The low band buffer circuit 43, mainly has a shift register 51 and a sample & hold section 52. The sample & hold section 52 is composed of four sample & hold circuits SH1, SH2, SH3 and SH4 in accordance with the number j of the dimension of the mean value vectors $\vec{x}L1$, $\vec{x}L2$, . . . .

In response to, for example, a clock signal from a control section (not shown), the shift register 51 derives trigger signals in a sequential manner to lines LB1 through LB4 which correspond to the sample & hold circuits SH1 through SH4 in a respective manner. The output from the mean value calculating circuit 11 is fed commonly to the sample & hold circuits SH1 through SH4 via the line LA. In response to the trigger signals, the sample & hold circuits SH1 through SH4 carry out sampling of the output from the mean value calculating circuit 11 in a sequential manner, and derives hold outputs to lines LL1 to LL4. As shown in FIG. 10, the mean values p of the processing unit blocks 7 in the low band compression processing unit blocks 8 are thus read in in a sequential manner, and the mean value vectors $\vec{x}L1$, $\vec{x}L2$, . . . can be generated.

Figure 12:
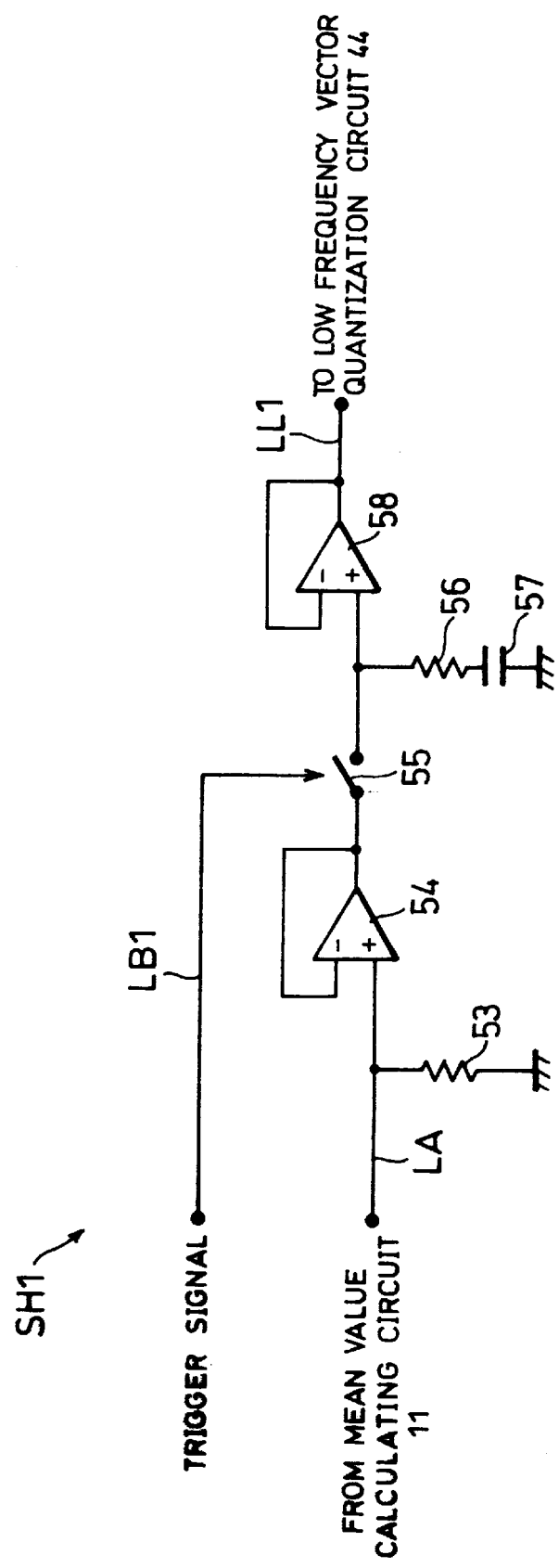
FIG. 12 is an electric circuit diagram showing a specific arrangement of a sample & hold circuit provided in the low band buffer circuit shown in FIG. 11.

The sample & hold circuit SH1 can be realized by, for example, an arrangement shown in FIG. 12. This sample & hold circuit SH1 includes a register 53 and amplifier 54 which constitute an input circuit for converting an output current from the mean value calculating circuit 11 into a voltage, a switch 55 for sampling an output from the amplifier 54 in response to the trigger signal, a register 56, capacitor 57, and amplifier 58 for holding an output from the switch 55. The other sample & hold circuits SH2 through SH4 can be arranged in the same manner.

The low band vector quantization circuit 44 receives as vector components voltage levels inputted from the low band buffer circuit 43 via the lines LL1 through LL4, and carries out mean-separated normalized vector quantization. The low band vector quantization circuit 44 has a similar arrangement to that of the image compressing apparatus 1b minus the low band vector quantization circuit 44, low band buffer circuit 43 and output selecting circuit 18b. In other words, The low band vector quantization circuit 44 can be arranged in the same manner as is a high band vector quantization section 46 which is composed of the input vector inversion selecting circuit 41, the mean value calculating circuit 11, the scalar product calculating circuit 12a, the inversion comparator circuit 42, a high band maximum scalar product value detecting circuit 13b, a high band index encoding circuit 16b, the A/D converters 14 and 15, a comparator 17, and the control circuit 45.

Figure 13:
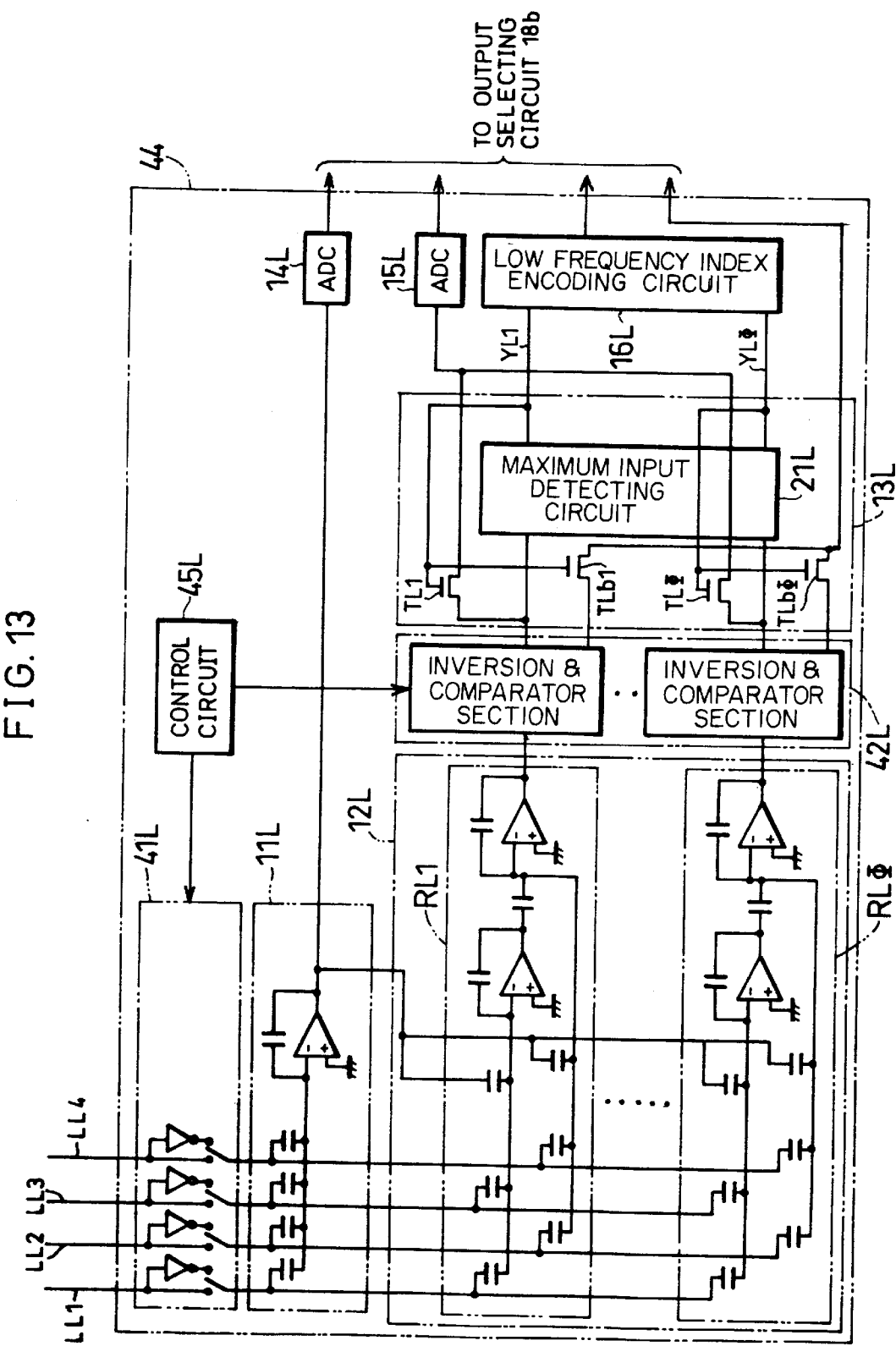
FIG. 13 is a block diagram showing a specific arrangement of a low band vector quantization circuit provided in the image compressing apparatus shown in FIG. 9.

FIG. 13 is a block diagram showing an electric arrangement of the low band vector quantization circuit 44. The signals inputted via the liens LL1 through LL4 are changed-over for non-inverted and inverted values alternatively by an input vector inversion selecting circuit 41L, and inputted to a low band mean value calculating circuit 11L. A mean value calculated by the low band mean value calculating circuit 11L is scalar-quantized by an A/D converter 14L and then inputted to the output selecting circuit 18b.

A low band scalar product value calculating circuit 12L for calculating scalar product values with respect to the input vectors $\vec{x}L1$, $\vec{x}L2$, . . . composed of the input signals is provided with scalar product value calculating sections RL$\phi$. The number of the scalar product value calculating sections RL$\phi$ corresponds to the number $\phi$ ($\phi$=1, 2, . . . , $\Phi$) of the code words. The scalar product value calculating section RL$\phi$ is composed of an amplifier for sum and product calculation and capacitors corresponding to the code components.

The inversion comparator circuit 42L controlled in interlock with the input vector inversion selecting circuit 41L by a control circuit 45L compares inverted and non-inverted values of the output from the scalar product value calculating section RL$\phi$ with each other, and a bigger value of the two is inputted to the low band maximum scalar product value detecting circuit 13L. A high-level output is derived from a maximum input detecting circuit 21L in the low band maximum scalar product value detecting circuit 13L only to the channel yielding a maximum value among output lines YL$\phi$ corresponding to the scalar product value calculating sections RL$\phi$. Next, the index IL of the channel to which that output is derived is encoded by the low band index encoding circuit 16L, and outputted to the output selecting circuit 18b. A code fL corresponding to the uppermost bit of the index IL representing whether the scalar product value here is a non-inverted or inverted value is inputted to the output selecting circuit 18b via a switching element TLb$\phi$. Moreover, a voltage level corresponding to the result of the calculation of the scalar product value of the channel yielding the maximum scalar product is inputted from the switching element TLb$\phi$ to an A/D converter 15L, quantized and then inputted to the output selecting circuit 18b.

As shown in FIG. 9, the output selecting circuit 18b receives a quantization code of a high band mean value $\mu$ from the A/D converter 14 in the high band vector quantization section 46, a quantization code of the absolute value of a high band maximum scalar product value P from the A/D converter 15, a code fb of the high band maximum scalar product value P from the high band maximum scalar product value detecting circuit 13b, an index I from the high band index encoding circuit 16b, and a flag f from the comparator circuit 17. Meanwhile, the output selecting circuit 18b receives a quantization code of a low band mean value $\mu$L from the A/D converter 14L in the low band vector quantization circuit 44, a quantization code of the absolute value of a low band maximum scalar product value PL from the A/D converter 15L, a code fL of the low band maximum scalar product value PL from the low band maximum scalar product value detecting circuit 13L, and an index IL from the low band index encoding circuit 16L. The output selecting circuit 18b, as shown in FIGS. 14 and 15, selectively outputs these codes and the index to the output line 3 as the code data in response to the flag f.

The code data outputted to the output line 3 are, for example, given to and transmitted by a transmitter, or given to and recorded by a recording apparatus. Therefore, the code data received by a receiver or reproduced by a reproducing apparatus are, first, decoded from the low band mean value $\mu$L, the low band index IL, and the low band maximum scalar product value PL into the image signals representing the mean value $\mu$ for every low band compression processing unit block 8. Next, in accordance with the judgement flag f, the signal level xk of each pixel is decoded from the index I and the maximum scalar product value P for every compression processing unit block 7 if the judgement flag f is 1, whereas the signal level xk is decoded with the mean value $\mu$ if the judgement flag f is 0. The decoded signal levels xk are sequentially arranged to be at places predetermined on the image to be decoded, and a decoded image is thus produced.

Note that the output selecting circuit 18b may be arranged to output the mean value $\mu$, the mean value $\mu$L obtained from the mean value $\mu$, the index IL, the maximum scalar product value PL, and the maximum scalar product value code fL selectively as necessary. For example, if the arrangement of the decoding side is to be simplified, the mean value $\mu$ may be transmitted. If the decoding side is arranged to be capable of decoding low band components which are vector-quantized with the mean-separated normalized vector quantization method, the mean value $\mu$L, the index IL, the maximum scalar product value PL, and the maximum scalar product value code fL may be outputted.

Figure 14:
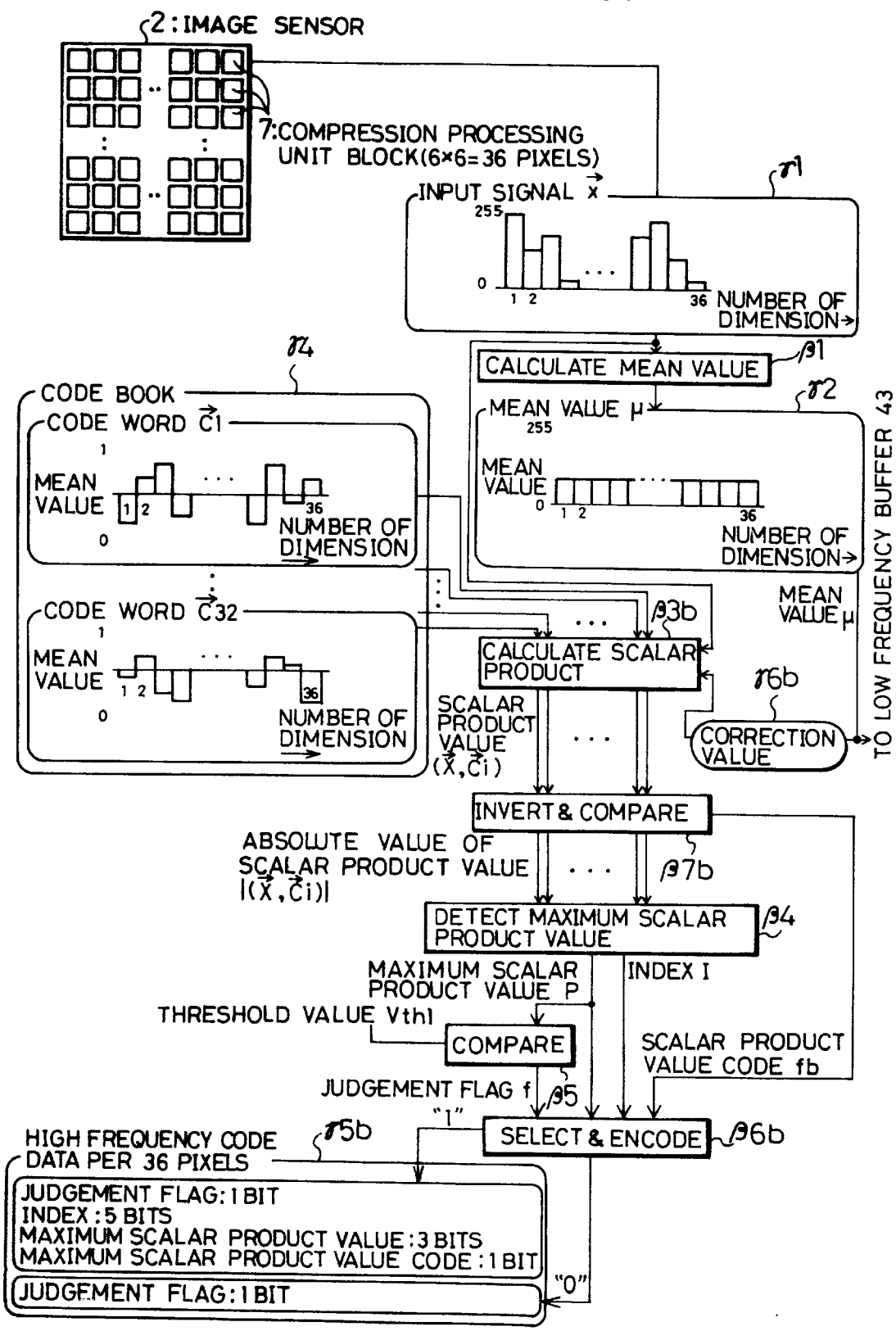
FIG. 14 is a flow chart showing compressing operation of high band components by the image compressing apparatus shown in FIG. 9.
Figure 15:
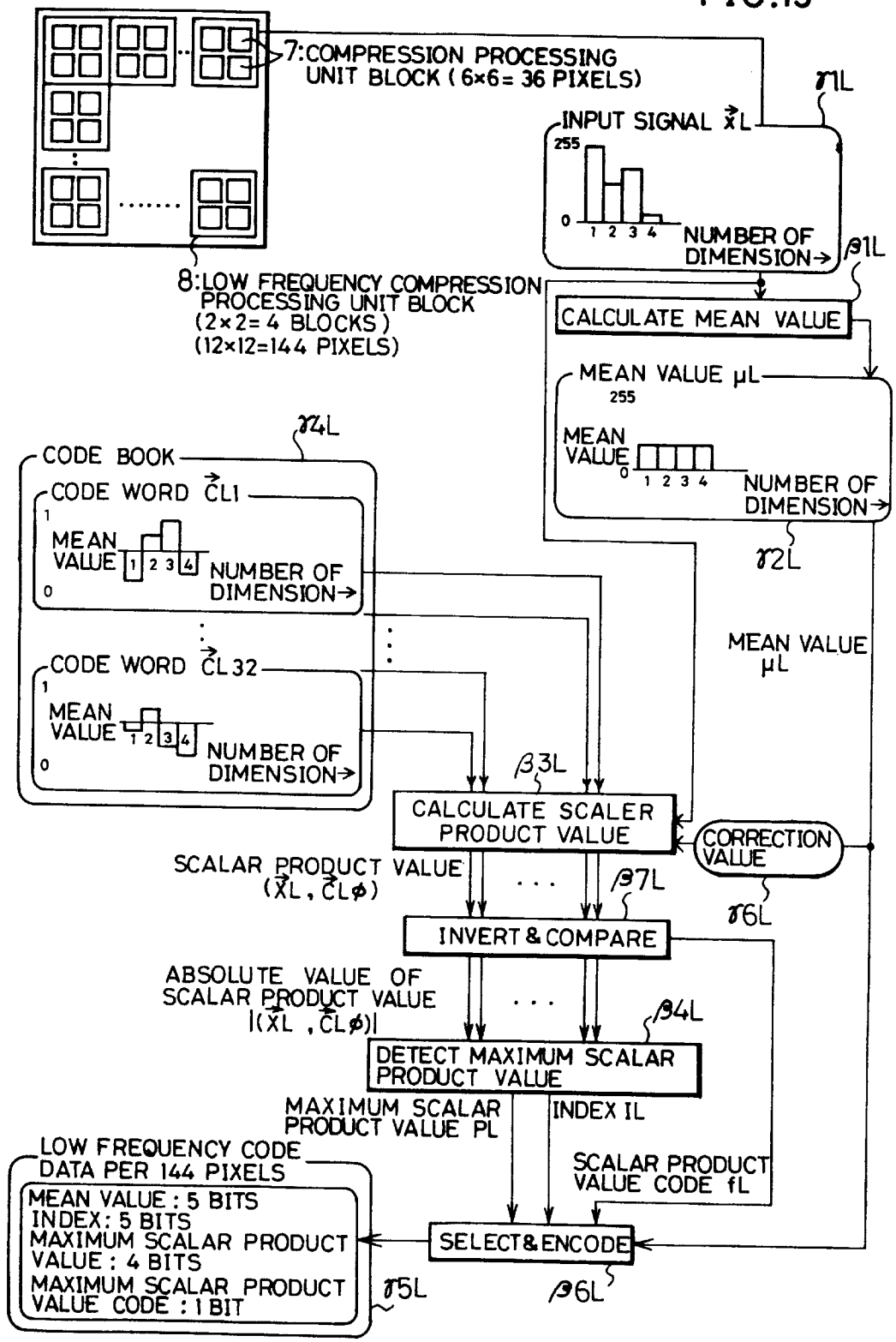
FIG. 15 is a flow chart showing compressing operation of low band components by the image compressing apparatus shown in FIG. 9.

FIGS. 14 and 15 are a flow chart illustrating compressing operation of the image compressing apparatus 1b arranged in the above manner. FIG. 14 shows operation of the high band vector quantization section 46, which is similar to the entire operation of the image compressing apparatus 1 shown in FIG. 4. Therefore, corresponding segments are indicated by the same reference numerals and description thereof is omitted.

In the high band vector quantization section 46, a correction value corresponding to quantization error in mounting the code component capacitors Hik (i=1 through 32, k=1 through 36) as shown in Eq. (18) is obtained as illustrated in $\gamma$ 6b from the mean value $\mu$ obtained in the step $\beta$1 and illustrated in $\gamma$ 2. In the step $\beta$3b, scalar product values of the input signal $\vec{c}$ with each of the code words C1 through C32 are calculated, and the calculated results are corrected by the correction values mentioned above to obtain the scalar product values ($\vec{X}$, $\vec{C}i$).

In the step $\beta$7b, the polarity of the scalar product value ($\vec{X}$, $\vec{C}i$) is inverted, and the inverted and non-inverted values are compared with each other. The absolute values $|(\vec{X}, \vec{C}i)|$ of the scalar product values of the input signal $\vec{x}$ with respect of the code words C1 through C32 are thus obtained. In the step $\beta$4, the maximum scalar product value P and its index are obtained. In the step $\beta$5, the maximum scalar product value P is compared with the threshold value Vthl, and the judgment flag is set or reset in accordance with the result of the comparison.

In the step $\beta$6b, in response to the judgement flag f, as illustrated in $\gamma$ 5b, for example, the judgement flag of 1 bit, the index I of 5 bits, the quantization code of the maximum scalar product value of 3 bits and the maximum scalar product value code fb of 1 bit are outputted per 36 pixels if the judgement flag f is 1, whereas only the judgement flag f is outputted per 36 pixels if the judgement flag f is 0. The mean values $\mu$ are sampled by the low band buffer circuit 43 as discussed above, and inputted to the low band vector quantization circuit 44 as the input signal $\vec{x}$L.

FIG. 15 is a flow chart illustrating compressing operation of the low band components of the low band vector quantization circuit 44. This operation is similar to the operation shown in FIG. 14, and therefore, corresponding segments in the FIG. 15 are indicated by the same reference numerals of two digits with the addition of the subscript L. As shown in FIG. 10, the low band buffer circuit 43 inputs 4-dimensional input signals $\vec{x}$L illustrated in $\gamma$1L for every low band compression processing unit block 8 composed of 4 blocks of the mean values $\mu$ of the compression processing unit blocks 7. The input signals $\vec{x}$L are for example, set to have resolution of 256 gradations.

In the step $\beta$1L, the mean value $\mu$L of the input signals $\vec{x}$L is calculated, and the low band mean value calculating circuit 11L outputs mean value signals illustrated in $\gamma$2L.

Meanwhile, the code words CL1 through CL32 which are realized in each scalar product value calculating section RL$\emptyset$($\emptyset$=32) by the normalized code component capacitors as illustrated in $\gamma$4L are formed in the scalar product calculating circuit 12L. The scalar product values of the input signals $\vec{x}$L with each of the code words CL1 through CL32 are calculated by the scalar product value calculating section $\beta$3L. From the results of the calculation, the correction values of the quantization error generated in accordance with the mean value $\mu$ as illustrated in $\gamma$6L are added to obtain the scalar product values ($\vec{X}$L, $\vec{C}$L$\emptyset$).

Meanwhile, in the step $\beta$7L, as in the step $\beta$7b, the polarity of the scalar product value ($\vec{X}$L, $\vec{C}$L$\emptyset$) is inverted, and the inverted and non-inverted values are compared with each other to obtain the absolute value $|(\vec{X}L, \vec{C}L\emptyset)|$ of the scalar product value. In the step $\beta$4L, as in the step $\beta$4, the maximum scalar product value is detected, and its maximum scalar product value PL and index IL are obtained. In the step $\beta$6L, as illustrated in $\gamma$5L, for example, the mean value $\mu$L of 5 bits, the index IL of 5 bits, the maximum scalar product value PL of 4 bits and the code fL of the maximum scalar product value of 1 bit are outputted per 144 pixels.

As discussed above, the image compressing apparatus 1b also receives the mean value $\mu$ of every compression processing unit block 7 as the input vector $\vec{x}$L for every compression processing unit block 8, carries out the mean-separated normalized vector quantization, and outputs the results. Therefore, the data amount having the mean value $\mu$ can be compressed without damaging the image quality. In other words, the data amount was compressed to 15 bits per 144 pixels in the example shown in FIG. 15, whereas the data amount was compressed to 5 bits per 36 pixels in the example shown in FIG. 4 discussed above.

In the above embodiments, calculation for the mean values, scalar product values and so on are carried out with analog circuits. Nonetheless, as another embodiment in accordance with the present invention, a digital circuit may carry out that calculation after the inputted image signal is converted from analog to digital. Moreover, instead of the arrangement show n in FIG. 3, the maximum output detecting circuit 21 may employ a different arrangement: for example, the arrangement suggested in the Japanese Patent Application No. 7-125372/1995 (Tokuganhei 7-125372) previously filed by the same inventors with the present invention.

The invention being thus described, it will be obvious that the same may be varied in many ways. Such variations are not to be regarded as a departure from the spirit and scope of the invention, and all such modifications as would be obvious to one skilled in the art intended to be include within the scope of the following claims.

What is claimed is:

1. An image compressing apparatus for receiving image signals as an input vector for every predetermined compression processing unit block and compressing the image signals with a mean-separated normalized vector quantization method, comprising:

a plurality of scalar product value calculating sections for calculating scalar product values of a difference component vector and a code word, the difference component vector being generated by subtracting a mean value of vector components of the input vector from each of the vector components, the code word being generated from image signals of a plurality of kinds of predetermined images for learning;

a scalar-quantization section for scalar-quantizing the mean value and a maximum scalar product value;

an encoding section for encoding an identification number of one of the code words, the code word yielding the maximum scalar product value through the calculation by said scalar product value calculating section;

a low band buffer for generating a low band vector for every low band compression processing unit block composed of a plurality of compression processing block units by receiving the mean values at a predetermined cycle;

a low band vector quantization section for vector-quantizing the low band vector with the mean-separated normalized vector quantization method;

a comparator section for judging whether the maximum scalar product value is not less than a predetermined threshold value; and an output selecting section for, in accordance with the judgement by said comparator section, outputting the quantization code of the maximum scalar product value from said scalar quantization section, the identification code of the code word from said encoding section, a quantization code of a low band mean value, a quantization code of a low band maximum scalar product value and a low band identification code, i. e., an identification number of the code word yielding the low band maximum scalar product value when the maximum scalar product value is not less than the threshold value, and outputting the quantization code of the low band mean value, the quantization code of the low band maximum scalar product value, and the low band identification code, wherein said output selecting section selectively outputs the quantization code of the mean value from said scalar quantization section, a quantization code of the low band mean value obtained by further vector-quantizing the mean value with the mean-separated normalized vector quantization method, the quantization code of the low band maximum scalar product value and the low band identification code.

2. The image compressing apparatus as defined in claim 1, wherein said low band buffer includes:
  a shift register for shifting a control signal and outputting the control signal as trigger signals in a sequential manner; and
  a plurality of sample & hold circuits for sampling and holding the mean value in accordance with the trigger signals from the shift register, and
said low band vector quantization section includes:
  said scalar product value calculating sections;
  said scalar quantization section;
  said encoding section; and
  said comparator section.

3. The image compressing apparatus as defined in claim 1, wherein each of said scalar product value calculating sections includes an amplifier and capacitors corresponding to code components of each of the code words, wherein said scalar product value calculating section calculates scalar product values of the input vector and each of the code words in a parallel manner for each of the code words by inputting input signals of a plurality of channels corresponding to the vector components to a terminal of each of the capacitors and connecting the other terminals of the capacitors commonly to the amplifier.

4. The image compressing apparatus as defined in claim 3, wherein capacities of the capacitors are set in a capacity ratio as the quantized code components, wherein each of said scalar product value calculation sections includes a correction capacitor corresponding to quantization error caused by the capacitor and inputs a product of a electrostatic capacity of the correction capacitor and the mean value to the amplifier as a correction value.

5. The image compressing apparatus as defined in claim 1, further comprising:

an input vector inversion selecting section for inverting polarity of the input vector and selectively changing-over obtained inverted and non-inverted values to be outputted; and an inversion & comparator section for, in accordance with the change-over operation of said input vector inversion selecting section, comparing the two scalar product values calculated by said scalar product value calculating section using the non-inverted and inverted values with each other, and outputting a greater scalar product value of the two and the code of the greater scalar product value.

6. The image compressing apparatus as defined in claim 1, wherein the code word is one of a plurality of vectors for learning obtained in accordance with inputted image signals, the vector for learning having a power greater than a predetermined threshold value and great change in images in the compression processing unit blocks.

7. An image compressing apparatus for receiving image signals as an input vector for every predetermined compression processing unit block and compressing the image signals with a mean-separated normalized vector quantization method, comprising:

a mean value calculating section for calculating a mean value of vector components of the input vector;

a mean value separating section for generating a difference component vector by subtracting the calculated mean value from each of the vector components of the input vector;

a memory section for storing vectors for learning generated from image signals of a plurality of kinds of predetermined images for learning as code words;

a scalar product value calculating section for calculating scalar product values of the difference component vector and each of the code words;

a maximum scalar product value detecting section for detecting one of the code words, the code word yielding a maximum scalar product value through the calculation;

a mean value quantization section for scalar-quantizing the mean value;

a gain quantization section for scalar-quantizing the maximum scalar product value;

a vector encoding section for encoding an identification number of the code word yielding the maximum scalar product value;

a low band buffer for generating a low band vector for every low band compression processing unit block composed of a plurality of compression processing block units by receiving the mean values at a predetermined cycle;

a low band vector quantization section for vector-quantizing the low band vector with the mean-separated normalized vector quantization method;

a comparator section for judging whether the maximum scalar product value is not less than a predetermined threshold value; and an output selecting section for, in accordance with the judgement by said comparator section, outputting the quantization code of the maximum scalar product value from said gain quantization section, the identification code of the code word from said vector encoding section, a quantization code of a low band mean value, a quantization code of a low band maximum scalar product value and a low band identification code, i. e., an identification number of the code word yielding the low band maximum scalar product value, instead of the quantization code of the mean value when the maximum scalar product value is not less than the threshold value, and outputting the quantization code of the low band mean value, the quantization code of the low band maximum scalar product value and the low band identification code when the maximum scalar product value is less than the threshold value, wherein said output selecting section selectively outputs the quantization code of the mean value from said mean value quantization section, a quantization code of the low band mean value obtained by further vector-quantizing the mean value with the mean-separated normalized vector quantization method, the quantization code of the low band maximum scalar product value and the low band identification code.

8. The image compressing apparatus as defined in claim 7, wherein said low band buffer includes:

a shift register for shifting a control signal and outputting the control signal as trigger signals in a sequential manner; and a plurality of sample & hold circuits for sampling and holding the mean value in accordance with the trigger signals from the shift register, and said low band vector quantization section includes:

said scalar product value calculating sections;

said scalar quantization section;

said encoding section; and said comparator section.

9. The image compressing apparatus as defined in claim 7, wherein each of said scalar product value calculating sections includes an amplifier and capacitors corresponding to code components of each of the code words, wherein said scalar product value calculating section calculates scalar product values of the input vector and each of the code words in a parallel manner for each of the code words by inputting input signals of a plurality of channels corresponding to the vector components to a terminal of each of the capacitors and connecting the other terminals of the capacitors commonly to the amplifier.

10. The image compressing apparatus as defined in claim 9, wherein capacities of the capacitors are set in a capacity ratio as the quantized code components, wherein each of said scalar product value calculation sections includes a correction capacitor corresponding to quantization error caused by the capacitor and inputs a product of a electrostatic capacity of the correction capacitor and the mean value to the amplifier as a correction value.

11. The image compressing apparatus as defined in claim 7, further comprising:

an input vector inversion selecting section for inverting polarity of the input vector and selectively changing-over obtained inverted and non-inverted values to be outputted; and an inversion & comparator section for, in accordance with the change-over operation of said input vector inversion selecting section, comparing the two scalar product values calculated by said scalar product value calculating section using the non-inverted and inverted values with each other, and outputting a greater scalar product value of the two and the code of the greater scalar product value.

12. The image compressing apparatus as defined in claim 7, wherein the code word is one of a plurality of vectors for learning obtained in accordance with inputted image signals, the vector for learning having a power greater than a predetermined threshold value and great change in images in the compression processing unit blocks.

13. An image compressing apparatus for receiving image signals as an input vector for every predetermined compression processing unit block and compressing the image signals with a mean-separated normalized vector quantization method, comprising:

a plurality of scalar product value calculating sections for calculating scalar product values of a difference component vector and a code word, the difference component vector being generated by subtracting a mean value of vector components of the input vector from each of the vector components, the code word being generated from image signals of a plurality of kinds of predetermined images for learning;

an input vector inversion selecting section for inverting polarity of the input vector and selectively changing-over obtained inverted and non-inverted values to be outputted;

an inversion & comparator section for, in accordance with the change-over operation of said input vector inversion selecting section, comparing the two scalar product values calculated by said scalar product value calculating section using the non-inverted and inverted values with each other, and outputting a greater scalar product value of the two and the code of the greater scalar product value;

a scalar-quantization section for scalar-quantizing the mean value and a maximum scalar product value;

an encoding section for encoding an identification number of one of the code words, the code word yielding the maximum scalar product value through the calculation by said scalar product value calculating section;

a comparator section for judging whether the maximum scalar product value is not less than a predetermined threshold value; and an output selecting section for, in accordance with the judgement by said comparator section, outputting the quantization code of the mean value from said scalar quantization section, the quantization code of the maximum scalar product value from said scalar quantization section and the identification code of the code word from said encoding section when the maximum scalar product value is not less than the threshold value, and outputting only the quantization code of the mean value when the maximum scalar product value is less than the threshold value.

14. An image compressing apparatus for receiving image signals as an input vector for every predetermined compression processing unit block and compressing the image signals with a mean-separated normalized vector quantization method, comprising:

a mean value calculating section for calculating a mean value of vector components of the input vector;

a mean value separating section for generating a difference component vector by subtracting the calculated mean value from each of the vector components of the input vector;

a memory section for storing vectors for learning generated from image signals of a plurality of kinds of predetermined images for learning as code words;

a scalar product value calculating section for calculating scalar product values of the difference component vector and each of the code words;

an input vector inversion selecting section for inverting polarity of the input vector and selectively changing-over obtained inverted and non-inverted values to be outputted;

an inversion & comparator section for, in accordance with the change-over operation of said input vector inversion selecting section, comparing the two scalar product values calculated by said scalar product value calculating section using the non-inverted and inverted values with each other, and outputting a greater scalar product value of the two and the code of the greater scalar product value;

a maximum scalar product value detecting section for detecting one of the code words, the code word yielding a maximum scalar product value through the calculation;

a mean value quantization section for scalar-quantizing the mean value;

a gain quantization section for scalar-quantizing the maximum scalar product value;

a vector encoding section for encoding an identification number of the code word yielding the maximum scalar product value;

a comparator section for judging whether the maximum scalar product value is not less than a predetermined threshold value; and an output selecting section for, in accordance with the judgement by said comparator section, outputting the quantization code of the mean value from said mean value quantization section, the quantization code of the maximum scalar product value from said gain quantization section and the identification code of the code word from said vector encoding section when the maximum scalar product value is not less than the threshold value, and outputting only the quantization code of the mean value when the maximum scalar product value is less than the threshold value.

* * * * *